(12) United States Patent
Miyasaka

(10) Patent No.: US 7,012,302 B2
(45) Date of Patent: Mar. 14, 2006

(54) COMPLEMENTARY THIN FILM TRANSISTOR CIRCUIT, ELECTRO-OPTICAL DEVICE, AND ELECTRONIC APPARATUS

(75) Inventor: Mitsutoshi Miyasaka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/771,431

(22) Filed: Feb. 5, 2004

(65) Prior Publication Data
US 2004/0173796 A1    Sep. 9, 2004

(30) Foreign Application Priority Data
Feb. 7, 2003    (JP)    ............ 2003-030995

(51) Int. Cl.
H01L 27/01    (2006.01)
(52) U.S. Cl. .............. 257/350; 257/347; 257/353
(58) Field of Classification Search ........... 257/347, 257/350, 351, 353, 354, 369, 903, 904, 64, 257/66, 70, 75
See application file for complete search history.

(56) References Cited

U.S. PATENT DOCUMENTS

| | | | |
|---|---|---|---|
| 5,637,515 A * | 6/1997 | Takemura | 438/162 |
| 5,639,698 A * | 6/1997 | Yamazaki et al. | 438/486 |
| 5,858,823 A * | 1/1999 | Yamazaki et al. | 438/166 |
| 6,319,761 B1 * | 11/2001 | Zhang et al. | 438/166 |
| 6,376,860 B1 * | 4/2002 | Mitanaga et al. | 257/57 |
| 6,413,842 B1 * | 7/2002 | Yamazaki et al. | 438/486 |
| 6,455,401 B1 * | 9/2002 | Zhang et al. | 438/486 |
| 6,492,659 B1 * | 12/2002 | Yamazaki et al. | 257/59 |

FOREIGN PATENT DOCUMENTS

| | | |
|---|---|---|
| JP | 9-172183 | 6/1997 |
| JP | A 2003-289040 | 10/2003 |

OTHER PUBLICATIONS

"Single Crystal Thin Film Transistors", IBM Technical Disclosure Bulletin, pp. 257-258, Aug. 1993.
Ryoichi Ishihara et al., "Advanced Excimer-Laser Crystallization Techniques of Si Thin-Film for Location Control of Large Grain on Glass", Proceedings of SPIE vol. 4295, pp. 14-23, 2001.

* cited by examiner

Primary Examiner—Tom Thomas
Assistant Examiner—N. Drew Richards
(74) Attorney, Agent, or Firm—Oliff & Berridge, PLC

(57) ABSTRACT

A first-conductivity-type thin film transistor and a second-conductivity-type thin film transistor are formed using a plurality of single crystal grains, the plurality of single crystal grains being formed substantially centered on each of a plurality of starting-point portions disposed on an insulating surface of a substrate, the plurality of single crystal grains being composed of at least a first single crystal grain and a second single crystal grain adjacent to each other, with a crystal grain boundary therebetween, the first-conductivity-type thin film transistor includes at least a first-conductivity-type drain region formed adjacent to the crystal grain boundary in the first single crystal grain, the second-conductivity-type thin film transistor includes at least a second-conductivity-type drain region formed adjacent to the crystal grain boundary in the second single crystal grain, and a common electrode is provided on the crystal grain boundary to lead out outputs from the first-conductivity-type drain region and the second-conductivity-type drain region.

6 Claims, 21 Drawing Sheets

COMPLEMENTARY THIN FILM TRANSISTOR CIRCUIT, ELECTRO-OPTICAL DEVICE, AND ELECTRONIC APPARATUS

BACKGROUND OF THE INVENTION

1. Field of Invention

The present invention relates to a complementary thin film transistor circuit (hereinafter, referred to as a CMOS circuit) including thin film transistors (TFTs). More particularly, the present invention relates to a complementary thin film transistor circuit including thin film transistors using a substantially monocrystalline semiconductor film made by performing laser irradiation on a semiconductor film, an electro-optical device using the same, and an electronic apparatus.

2. Description of Related Art

As a method to fabricate a thin film transistor on a general purpose glass substrate at a low temperature, a related art method is disclosed in which a hole is punched in an insulating film on a substrate, an amorphous silicon film is formed on this insulating film and in the hole, and thereafter laser light is irradiated on the amorphous silicon film, while maintaining an unmelted amorphous silicon in the bottom portion of the hole and a melted amorphous silicon film in the other portions, in order to generate a crystal growth using the amorphous silicon that is maintained in the unmelted state as a crystal nucleus, thereby providing a region centered on the hole in a surface of the amorphous silicon film as a substantially monocrystalline silicon film, as described in "Single Crystal Thin Film Transistors" (IBM Technical Disclosure Bulletin August 1993 pp257–258) and "Advanced Excimer-Laser Crystallization Techniques of Si Thin-Film For Location Control of Large Grain on Glass" (R. Ishihara et al., proc. SPIE 2001, vol. 4295, p14–23.) described below.

Because this substantially monocrystalline semiconductor film has no crystal grain boundaries or less crystal grain boundaries, when carriers, such as electrons or holes flow, a barrier is significantly reduced as compared to a polycrystalline semiconductor film.

By constructing a semiconductor device using this substantially monocrystalline semiconductor film in the semiconductor thin film, an off-current suppressing effect or mobility thereof is excellent, thereby being capable of easily realizing a thin film transistor that is compatible with a high-speed operation.

When a CMOS circuit including the thin film transistor formed using this substantially monocrystalline thin film is constructed, two contacts are required for leading out an output electrode from each of the two thin film transistors constituting the CMOS circuit. However, the spacing between the transistors tends to be reduced and the thin film transistors used in a driver circuit or the like also tend to become small as a result of the recent trends towards miniaturization of electronic devices. This is also the case in the CMOS circuits. In this case, because the output contact region becomes narrow, this prevents the realization of good contacts, which in turn causes a problem of hindering miniaturization. Further, in case of not attempting miniaturization, good contacts in which the output contact region becomes narrow may not be obtained depending on constructions.

SUMMARY OF THE INVENTION

The present invention is, therefore, conceived to address the aforementioned problems with the related art, and the present invention provides a complementary thin film transistor circuit capable of realizing sufficient contact by a simple construction, thus allowing miniaturization. Further, the present invention provides an electro-optical device using the complementary thin film transistor circuit, and an electronic apparatus.

A complementary thin film transistor circuit of an aspect of the present invention is characterized in that it includes a first-conductivity-type thin film transistor and a second-conductivity-type thin film transistor formed using a plurality of single crystal grains, the plurality of single crystal grains being formed using a plurality of starting-point portions disposed on an insulating surface of a substrate, the starting point potions being origins of the crystal grain, the plurality of single crystal grains being composed of at least a first single crystal grain and a second single crystal grain adjacent to each other, with a crystal grain boundary therebetween, the first-conductivity-type thin film transistor includes at least a first-conductivity-type drain region which is formed adjacent to the crystal grain boundary in the first single crystal grain, the second-conductivity-type thin film transistor includes at least a second-conductivity-type drain region which is formed adjacent to the crystal grain boundary in the second single crystal grain; and a common electrode is provided on the crystal grain boundary to lead out outputs from the first-conductivity-type drain region and the second-conductivity-type drain region.

In the thus constructed complementary thin film transistor circuit according to an aspect of the present invention, it is not required to place electrodes for taking out outputs by providing contacts in respective drain regions, thereby significantly reducing the spacing between the transistors. Even when a large contact region cannot be secured, it is possible to securely obtain a contact to lead out an output. Further, because a crystal grain boundary portion becomes thick due to a protruded semiconductor film, electric contact resistance between both drain regions and a wiring formed of a metal and the like becomes low. That is, it minimizes a parasite capacitance not required in the circuit. Accordingly, miniaturization, high integration, and reliability of the circuit itself is obtained.

Further, a complementary thin film transistor circuit of an aspect of the present invention is characterized in that it includes a first-conductivity-type thin film transistor and a second-conductivity-type thin film transistor formed using a plurality of single crystal grains, the plurality of single crystal grains being formed substantially centered on each of a plurality of starting-point portions disposed on an insulating surface of a substrate, the starting point potions being origins of the crystal grain, the plurality of single crystal grains being composed of a first crystal grain, and at least second and third crystal grains adjacent to each other, with the first crystal grain and an high-concentration impurity region therebetween, the first-conductivity-type thin film transistor including at least a first-conductivity-type drain region which is provided in the first single crystal grain, the first constructive drain region being formed adjacent to a starting-point portion included in the first crystal grain, and a first-conductivity-type source region which is provided in the second crystal grain, the second-conductivity-type thin film transistor includes at least a second-conductivity-type drain region which is provided in the first single crystal grain, the second-conductivity-type drain region being formed adjacent to the starting-point portion included in the first crystal grain, and a second-conductivity-type source region which is provided in the third crystal grain; and a common electrode is provided on the starting-point portion included in the first crystal grain to lead out outputs from the first-conductivity-type drain region or the second-conductivity-type drain region.

In the constructed complementary thin film transistor circuit according to an aspect of the present invention, it is not required to place electrodes for leading out outputs by providing contacts in respective drain regions, thereby significantly reducing the spacing between the transistors. Because a large contact region can be obtained by doing so, it is possible to lead out outputs by securely obtaining the contact. Further, since the starting-point portion has a thick semiconductor film or metal, a contact resistance can be lowered. In this way, miniaturization, high integration and reliability of the circuit itself is obtained.

The single crystal grain may be formed by performing a heat treatment on the amorphous or polycrystalline semiconductor film. The thus formed single crystal grain becomes a good quality single crystal grain, and a complementary thin film transistor circuit having good characteristics can be realized by forming a thin film transistor using the grain.

Further, the above-mentioned starting-point portion may be a concave portion formed on the insulating substrate. In addition to this, a metal, such as nickel, palladium, germanium or the like, may be disposed in the starting-point portion, which the metal promotes a crystal growth. Accordingly, a position at which crystallization originates is easily and securely controlled to form a single crystal grain, thereby realizing a complementary thin film transistor circuit capable of controlling accurately a position to be formed.

It is preferable that the single crystal grain, which possesses a concave portion as the starting-point portion, is formed through the heat treatment process under the condition that an unmelted portion is left at a semiconductor film in the concave portion and the other portions are melted. Crystallization of the semiconductor film after the heat treatment progresses from the inside of the unmelted concave portion, in particular, from the vicinity of a bottom portion to a peripheral portion thereof. At this time, by appropriately setting a dimension of the concave portion, only one crystal grain reaches an upper portion (i.e., opening) of the concave portion. At the melted portion of the semiconductor film, since crystallization is achieved by adopting one crystal grain arrived at the upper portion of the concave portion as a nucleus, the semiconductor film including the single crystal grain can be formed in a range substantially centered on the concave portion. In this way, a good quality of single crystal grain is obtained, and by using this single crystal, a thin film transistor having good characteristics can be realized.

Further, it is preferable that the above-mentioned heat treatment be performed by laser irradiation. By using the laser, the heat treatment can be performed effectively and securely, thereby forming a single crystal grain effectively and securely. As a laser used herein, there are several lasers, such as an excimer laser, a solid state laser, a gas laser, and the like. The heat treatment, when a metal is disposed at the starting-point portion, may use an electric heating furnace or a rapid heat treatment system. At this time, the crystallization progresses towards a solid state.

It is preferable that the above-mentioned single crystal grain be a silicon single crystal grain formed by performing a heat treatment on an amorphous or polycrystalline silicon film. Accordingly, a thin film transistor can be formed using a good quality of silicon single crystal grain, thereby realizing a complementary thin film transistor circuit having good characteristics.

Further, the above-mentioned complementary thin film transistor circuit is suitable for, for example a driver device for driving a display pixel in a liquid crystal device or an organic electroluminescent (EL) display device. In this way, it is possible to construct an electro-optical device having an excellent display quality.

A good quality electronic apparatus can be constructed by constructing the electronic apparatus using the above-mentioned complementary thin film transistor circuit, for example, using this electro-optical device.

DETAILED DESCRIPTION OF EXEMPLARY EMBODIMENTS

Hereinafter, exemplary embodiments of the present invention will be described in detail with reference to the accompanying figures. Also, the present invention is not limited to the following description, and may be appropriately altered without departing from the scope of the present invention.

First Exemplary Embodiment

Figure 1:
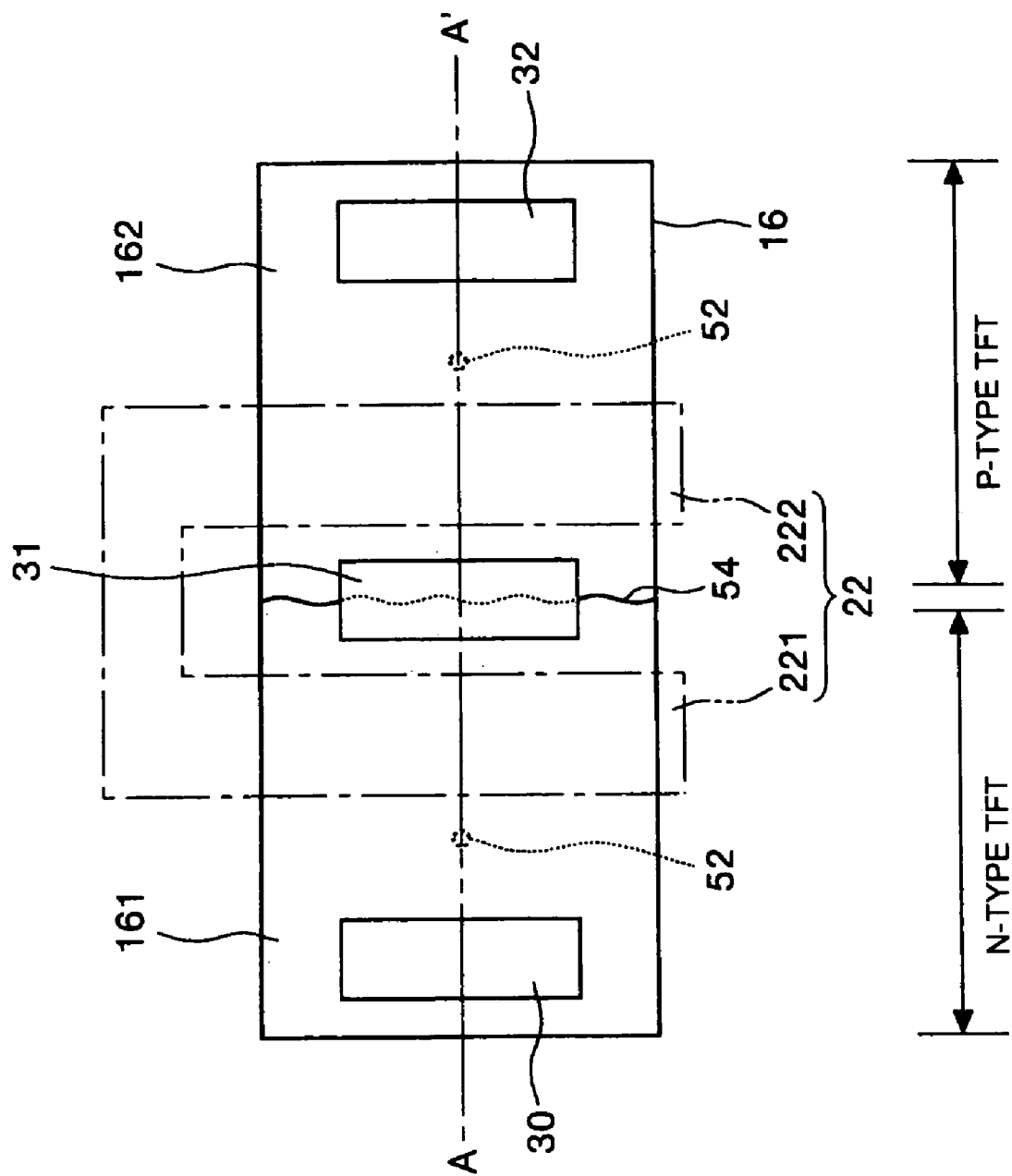
FIG. 1 is a plan view illustrating a CMOS circuit according to an exemplary embodiment of the present invention.
Figure 2:
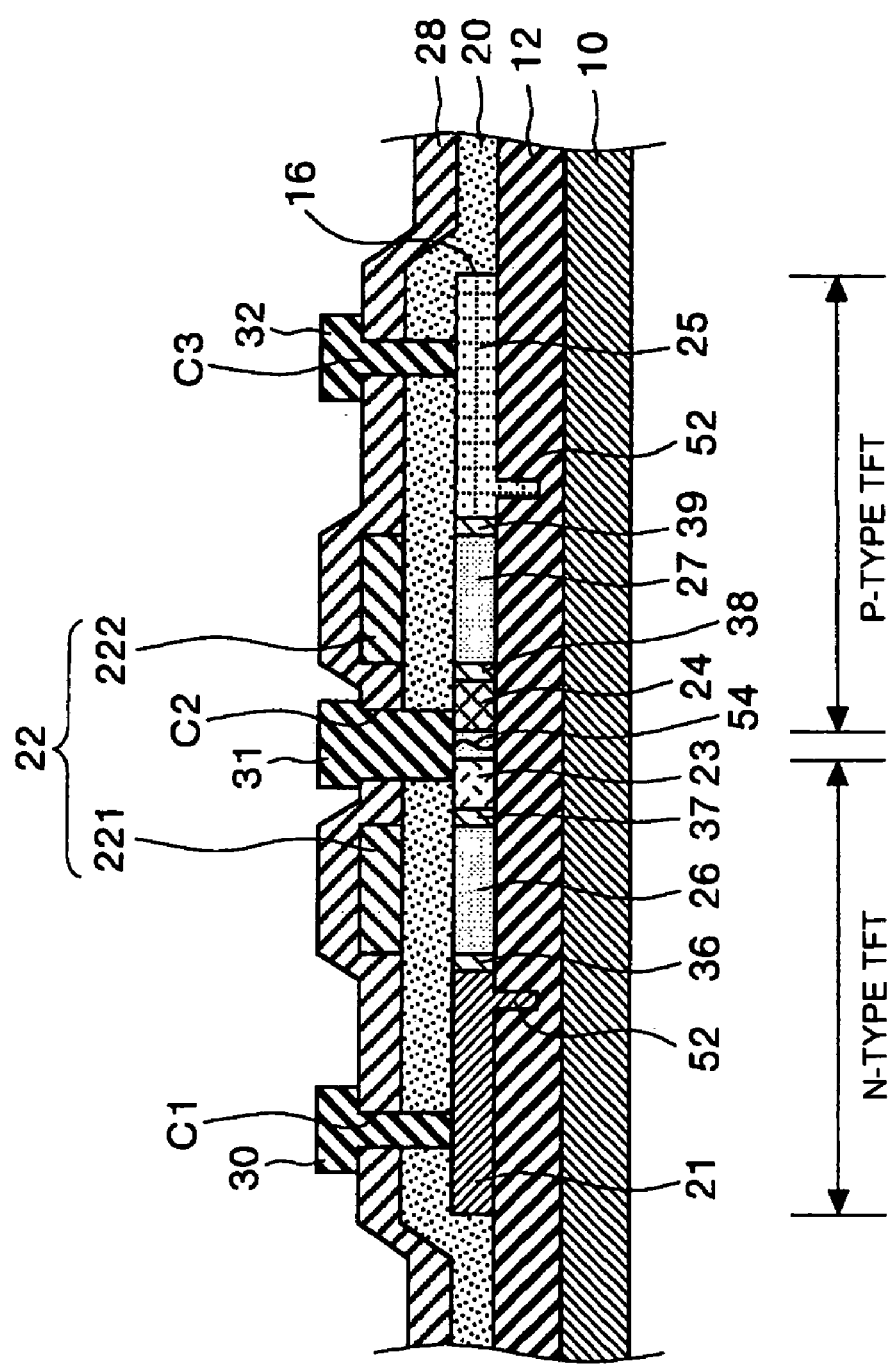
FIG. 2 is a cross-sectional view illustrating a CMOS circuit according to an exemplary embodiment of the present invention.
Figure 3:
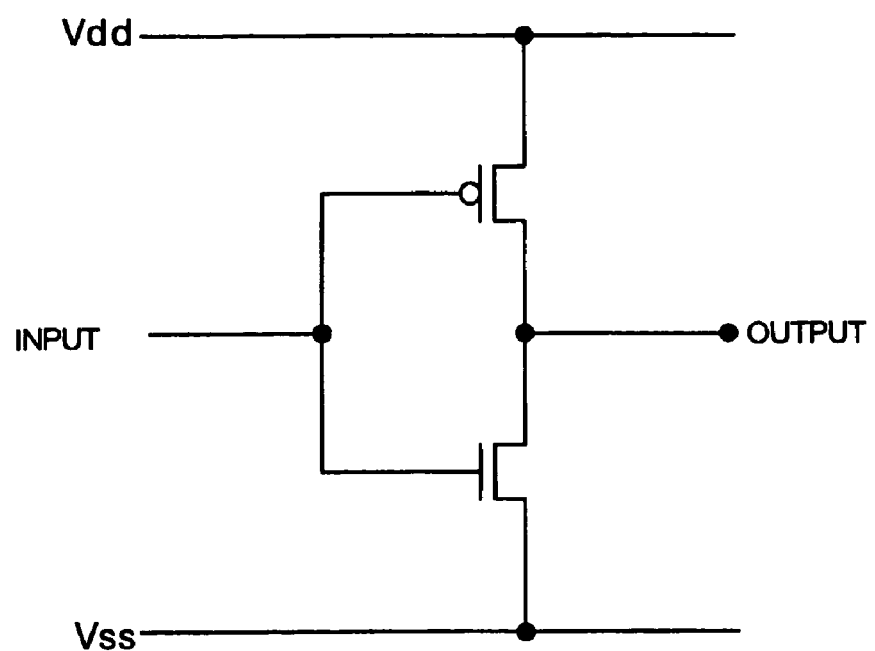
FIG. 3 is a circuit schematic of a CMOS circuit according to an exemplary embodiment of the present invention.

FIGS. 1 and 2 illustrate the construction of an inverter, which is a NOT circuit having a CMOS circuit, according to an aspect of the present invention, in which FIG. 1 is a plan view and FIG. 2 is a cross-sectional view taken along plane A–A' shown in FIG. 1. Also, a circuit schematic of this CMOS circuit is shown in FIG. 3. In FIG. 1, a gate electrode and transistor regions (source region, drain region, and channel region) are primarily highlighted, and other elements are omitted. Further, in FIG. 1, in order to easily recognize a shape of channel region 26 and the like, a gate electrode 22 is drawn with a dashed line, and the channel region 26, under the gate electrode is also drawn.

The CMOS circuit according to the present exemplary embodiment is constructed by forming two types of thin film transistors, a first-conductivity-type thin film transistor and a second-conductivity-type thin film transistor, on a glass substrate 10, as shown in FIG. 2. Hereinafter, the construction thereof will be described in detail.

As shown in FIG. 2, an insulating film 12 is formed on the glass substrate 10, and a substantially monocrystalline silicon film 16, which is a semiconductor film, is formed thereon. Further, a plurality of starting-point portions 52, which are origins of crystallization of the semiconductor film, are formed in the insulating film 12 to be of a concave shape in the thickness direction. In the explanation below, the starting-point portion (i.e., concave portion) is referred to as "grain filter"; the starting-point portion is flat, and a metal, such as a nickel and the like, which promotes silicon crystal growth, may be placed thereon. The grain filter 52 is buried by the substantially monocrystalline silicon film 16. Herein, the substantially monocrystalline silicon film 16 is, as described below, composed of a plurality of single crystal grains formed centered on the grain filter 52, specifically, of two adjacent single crystal grains 161 and 162 formed in a substantially square shape.

Two thin film transistors, namely, an N-type thin film transistor (hereinafter, referred to as NMOS transistor) and a P-type thin film transistor (hereinafter, referred to PMOS transistor) are formed using the two adjacent single crystal grains 161 and 162, and the CMOS circuit is composed of these thin film transistors.

As shown in FIG. 2, the NMOS transistor is formed using the single crystal grain 161 of the substantially monocrystalline silicon film 16 as patterned. In the single crystal grain 161, a peripheral region of the crystal grain boundary 54 becomes a high-concentration drain region 23, and a region at a side opposing the crystal grain boundary 54 becomes a high-concentration source region 21. The portion sandwiched between the source and drain regions 21 and 23 is the channel region 26.

Further, electric field relief regions 36 and 37, composed of a low-concentration impurity region, are formed at both sides, with the channel region 26 therebetween, and have a LDD (Lightly Doped Drain) structure. In this way, the hot electron effect is suppressed, thereby constructing a highly reliable thin film transistor. Further, in an aspect of the present invention, the LDD structure provided with the electric field relief regions 36 and 37 is not essential; any structure is allowed in which the electric field relief regions are not provided.

Further, over the channel region 26, on a silicon oxide film 20 a gate electrode 221 is formed, which is interconnected to a gate electrode 222 to form the gate electrode 22; a silicon oxide film 28 is also formed.

Over the source region 21, a source electrode 30 is formed, with the silicon oxide film 20 and the silicon oxide film 28 therebetween. The source electrode 30 is connected to the source region 21 via a contact hole C1.

Further, over the drain region 23, a drain electrode 31 for output is formed, with the silicon oxide film 20 and the silicon oxide film 28 therebetween. Herein, an output drain electrode 31 forms a common electrode for the PMOS transistor. The output drain electrode 31 is connected to the drain region 23 via a contact hole C2.

Meanwhile, the PMOS transistor is formed on the single crystal grain 162 of the substantially monocrystalline silicon film 16 as patterned. In the single crystal grain 162, a peripheral region of the crystal grain boundary 54 becomes a high-concentration drain region 24, and a region at the side opposing the crystal grain boundary 54 becomes a high-concentration source region 25. The portion sandwiched between the source and drain regions 24 and 25 is a channel region 27.

Further, electric field relief regions 38 and 39 composed of low-concentration impurity regions are formed at both sides, with the channel region 27 therebetween, which is an LDD (Lightly Doped Drain) structure. In this way, the hot electron effect is suppressed, thereby constructing a highly reliable thin film transistor. Further, in an aspect of the present invention, the LDD structure provided with the electric field relief regions 38 and 39 is not essential; any structure is allowed in which the electric field relief regions are not provided.

Further, over the channel region 27, on the silicon oxide film 20 a gate electrode 222 is formed, which is interconnected to the gate electrode 221 to form the gate electrode 22; the silicon oxide film 28 is also formed.

Over the source region 25, a source electrode 32 is formed with the silicon oxide film 20 and the silicon oxide film 28 therebetween. The source electrode 32 is connected to the source region 25 via a contact hole C3.

Further, an output drain electrode 31 is formed over the drain region 24, with the silicon oxide film 20 and the silicon oxide film 28 therebetween. Herein, the output drain electrode 31 is led out by a single contact from the drain regions of both transistors, and forms a common electrode for the NMOS transistor. The output drain electrode 31 is connected to the drain region 24 via the contact hole C2.

By this structure, in this CMOS circuit, an output from the drain region 23 of the NMOS transistor and an output from the drain region 24 of the PMOS transistor can be led out by a single contact, namely, the drain electrode 31.

In known CMOS circuits, a contact and a drain electrode for an output had to be led out from each of the drain regions 23 and 24 in order to lead out respective outputs from the drain regions 23 and 24. In this case, since two contacts and drain electrodes for the output are formed, it is necessary to secure a width sufficient for two electrodes. Further, when taking manufacturing tolerances into consideration, it is necessary to provide a larger width to form the drain electrode for the output. However, a sufficient width cannot always be secured depending on miniaturization and fabrication of the thin film transistor, and because there is insufficient contact to the source/drain electrode in this case, it may affect the reliability of the circuit operation.

Accordingly, in the CMOS circuit of the present exemplary embodiment, a contact, namely, a drain electrode for an output is formed on a crystal grain boundary 54 of adjacent single crystal grains 161 and 162 as a common electrode for the NMOS transistor and the PMOS transistor. There is an advantage in that it is easy to come in contact with a metal, which becomes an electrode, because a semiconductor film protrudes from other regions on the crystal grain boundary.

In this CMOS circuit, it is possible to form a drain electrode in a smaller region as compared to a related art region because outputs from the drain regions 23 and 24 are led out by one contact, namely, the drain electrode 31. Accordingly, this is compatible with CMOS circuit miniaturization. Further, it is possible to securely obtain a contact when a large region for the output drain electrode cannot be secured, due to the structure of the circuit, by adopting one contact, namely, the drain electrode.

Further, in this CMOS circuit, in forming each thin film transistor, the gate electrodes 221 and 222 are formed while avoiding the grain filter 52, and the channel regions 26 and 27 are formed between respective single crystal grains 161 and 162 while avoiding the grain filter 52.

Normally, scattering by, for example, crystal defects easily occurs in the region including the grain filter 52, which thus causes deviation and degradation of the electrical characteristics, such as degradation of mobility. In particular, if the channel region is formed in the region including the grain filter 52, good characteristics cannot be obtained.

However, in this CMOS circuit, because the channel regions 26 and 27 are formed while avoiding the grain filter 52 in each thin film transistor, deviation or degradation of mobility is not caused due to the influence of the grain filter 52, thereby realizing a CMOS circuit having excellent characteristics, such as mobility or the like.

Further, although the PMOS and NMOS transistors are formed on two adjacent single crystal grains 161 and 162, respectively, to construct the CMOS circuit in the present exemplary embodiment, the PMOS and NMOS transistors may be formed by using a plurality of single crystal grains, respectively.

Next, the method of fabricating the CMOS circuit will be described. According to an aspect of the present invention, the CMOS circuit is formed by a process of forming a silicon film used as an active region of a thin film transistor on a glass substrate, and a process of forming the thin film transistor using the formed silicon film. Hereinafter, each process will be described in detail.

Figure 4:
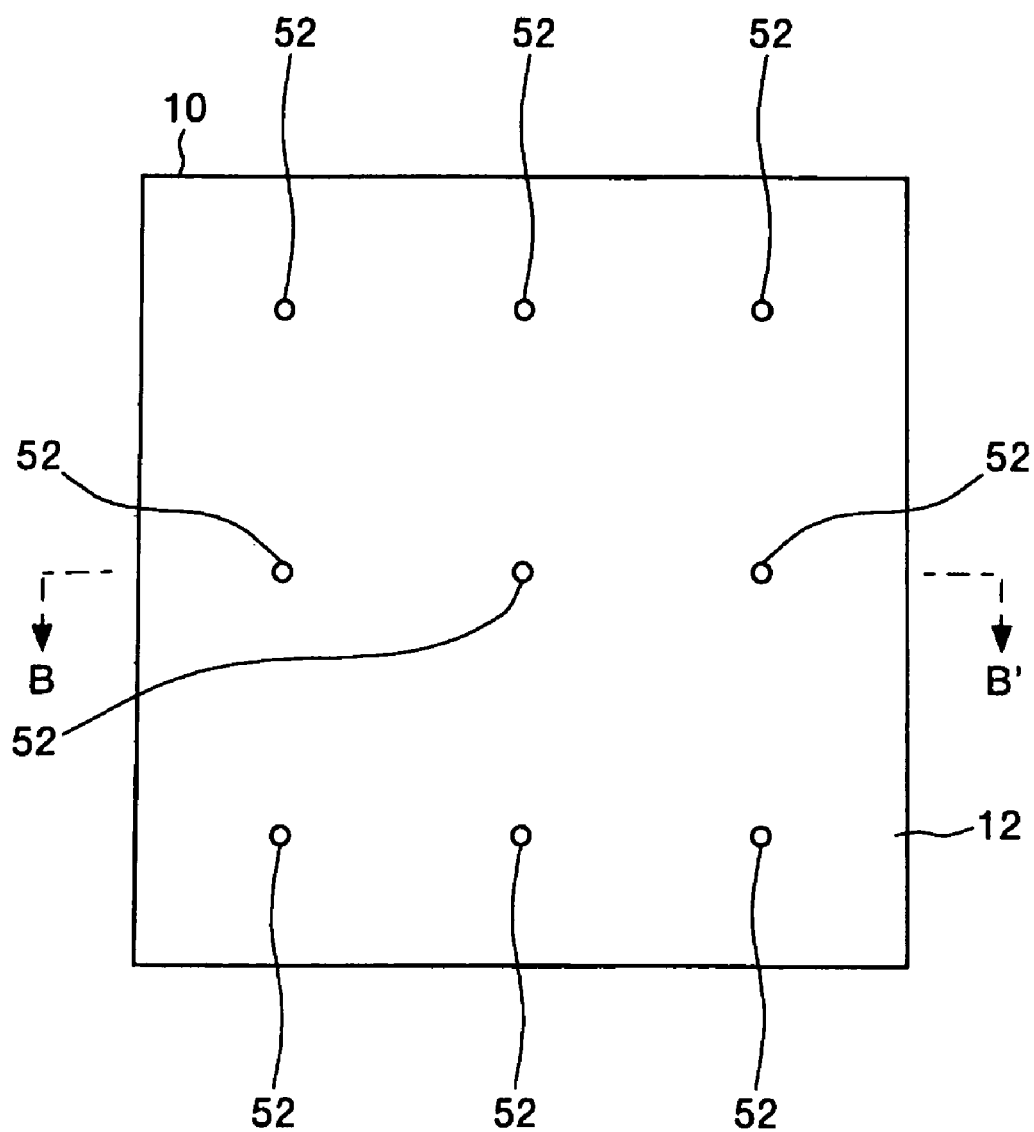
FIG. 4 is a plan view explaining a method of forming a silicon film.

FIGS. 4 and 5 explain a process of forming a silicon film. FIG. 4 illustrates a partial plan view of the glass substrate 10 on which the silicon film is formed. FIG. 5 corresponds to a section taken along plane B–B' shown in FIG. 4.

Figure 5A:
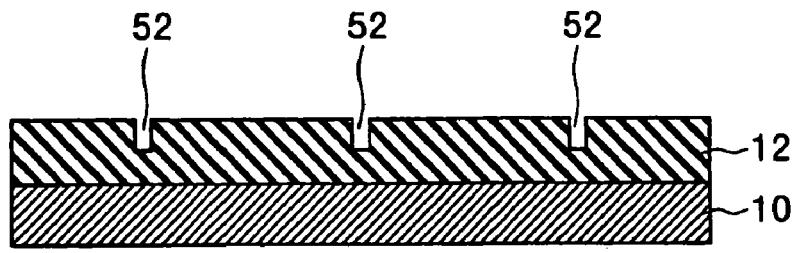
FIGS. 5(A)–5(B) are process views explaining an exemplary method of forming a silicon film.

As shown in FIGS. 4 and 5(A), a silicon oxide film 12 as an insulating film is formed on the glass substrate (insulating substrate) 10. This silicon oxide film 12 may be formed by various film forming methods, such as a plasma enhanced chemical vapor deposition (PECVD) method, low-pressure chemical vapor deposition (LPCVD) method, a sputtering method or the like.

Next, a plurality of starting-point portions 52 that become starting points upon crystallization of the semiconductor film, namely, grain filters 52, are formed in the silicon oxide film 12 by appropriately setting the displacement intervals so that they are arranged regularly. This grain filter 52 serves to preferentially grow only one crystal nucleus and is formed in a concave shape. It is preferable that the grain filter 52 in the present exemplary embodiment be formed in, for example, a cylindrical shape having a diameter of about 100 nm and a height of about 750 nm. Further, apart from the cylindrical shape, the grain filter 52 may have, for example, a prism shape.

For example, the grain filter 52 can be formed as follows. First of all, the silicon oxide film 12 is coated with a photoresist film using a mask positioned on the grain filter 52. This photoresist film is exposed and developed to form a photoresist film (not shown) having an opening for exposing a formation position of the grain filter 52 on the silicon oxide film 12.

The formation position of the grain filter 52 is etched selectively by performing reactive ion etching using the photoresist film as a mask. Thereafter, the grain filter 52 can be formed by eliminating the photoresist film on the silicon oxide film 12.

Further, in forming the grain filter 52 to have a smaller diameter, it can be formed by forming a concave portion and thereafter growing an oxide film on a sidewall of the concave portion (hole portion) in the radial direction by the PECVD method and or like, to make the hole diameter small.

Figure 5B:
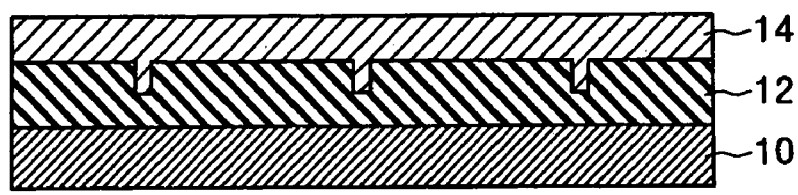

Next, as shown in FIG. 5(B), a semiconductor film is formed on the silicon oxide film 12 and in the grain filter 52 by a film forming method, such as an LPCVD method or the like. In the present exemplary embodiment, an amorphous silicon film 14 is formed as the semiconductor film. It is preferable that this amorphous silicon film 14 be formed to have a film thickness of about 50 to 500 nm. Alternatively, a polycrystalline silicon film may be formed in place of the amorphous silicon film 14.

Figure 5C:
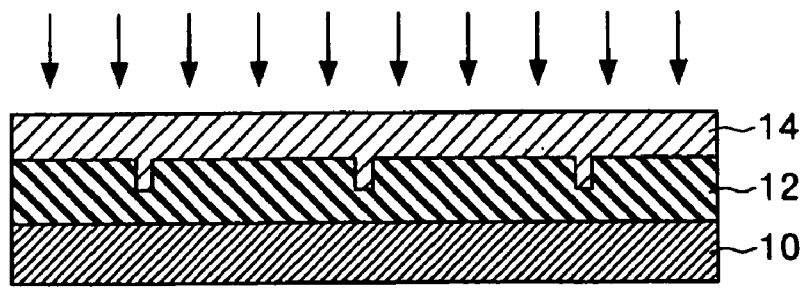

Next, as shown in FIG. 5(C), the amorphous silicon film 14 is heat-treated by laser irradiation, and a plurality of single crystal grains are formed substantially centered on each grain filter 52. It is preferable that this laser irradiation use, for example, a XeCl pulsed excimer laser having a wavelength of 308 nm and a pulse width of 20 to 30 ns so that the energy density is 0.4 to 1.5 J/cm$^2$. By performing the laser irradiation in this condition, most of the irradiating laser light is absorbed at the vicinity of the surface of the silicon film 14. This reason is that the absorption coefficient of the amorphous silicon is relatively large, namely, 0.139 nm$^{-1}$, at the wavelength (308 nm) of the XeCl pulsed excimer laser.

Further, in the laser irradiation of the silicon film 14, the irradiation method can be appropriately selected according to the capability (irradiatable area) of the laser irradiation apparatus used. For example, if the irradiatable area is small, a method of selectively irradiating each grain filter 52 and a peripheral area thereof can be considered. Further, if the irradiatable area is relatively large, a method of sequentially selecting ranges including several grain filters 52 and repeating laser irradiation to these ranges several times, or the like can be considered. Further, in the case of high device capability, a range including all grain filters 52 may be laser-irradiated by a single laser irradiation.

By properly selecting the conditions for the above-mentioned laser irradiation, an unmelted portion of the silicon film 14 is left at the bottom portion in the grain filter 52, the other portions are substantially completely melted. In this way, silicon crystal growth after laser irradiation first originates from the unmelted portion around the bottom portion of the grain filter 52, toward the vicinity of the surface of the silicon film 14, namely, the substantially completely melted portion.

Figure 5D:
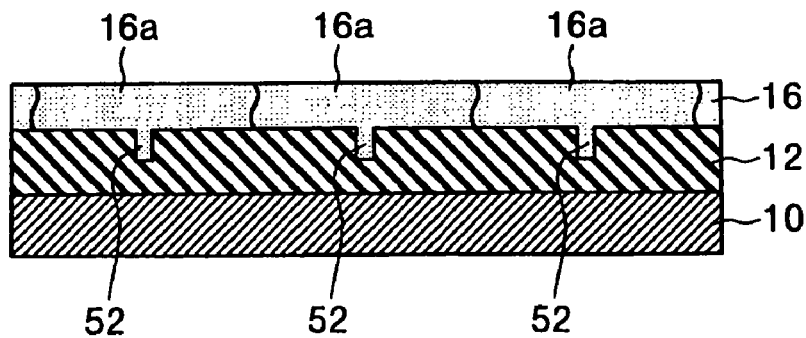

Several crystal grains are generated at the bottom portion of the grain filter 52. At this time, only one crystal grain reaches the top portion (opening) of the grain filter 52 by setting the cross-sectional dimension of the grain filter 52 (diameter of a circle in the present exemplary embodiment) identical to or slightly smaller than one crystal grain. In this way, in the substantially completely melted portion of the silicon film 14, a crystal growth progresses by using one crystal grain arriving at the upper portion of the grain filter 52 as a nucleus, and the silicon film 16 is formed by regularly arranging crystal grains of a large grain diameter centered on the grain filter 52, that is, the silicon films 16a composed of the substantially single crystal grains, as shown in FIG. 5(D).

Figure 6:
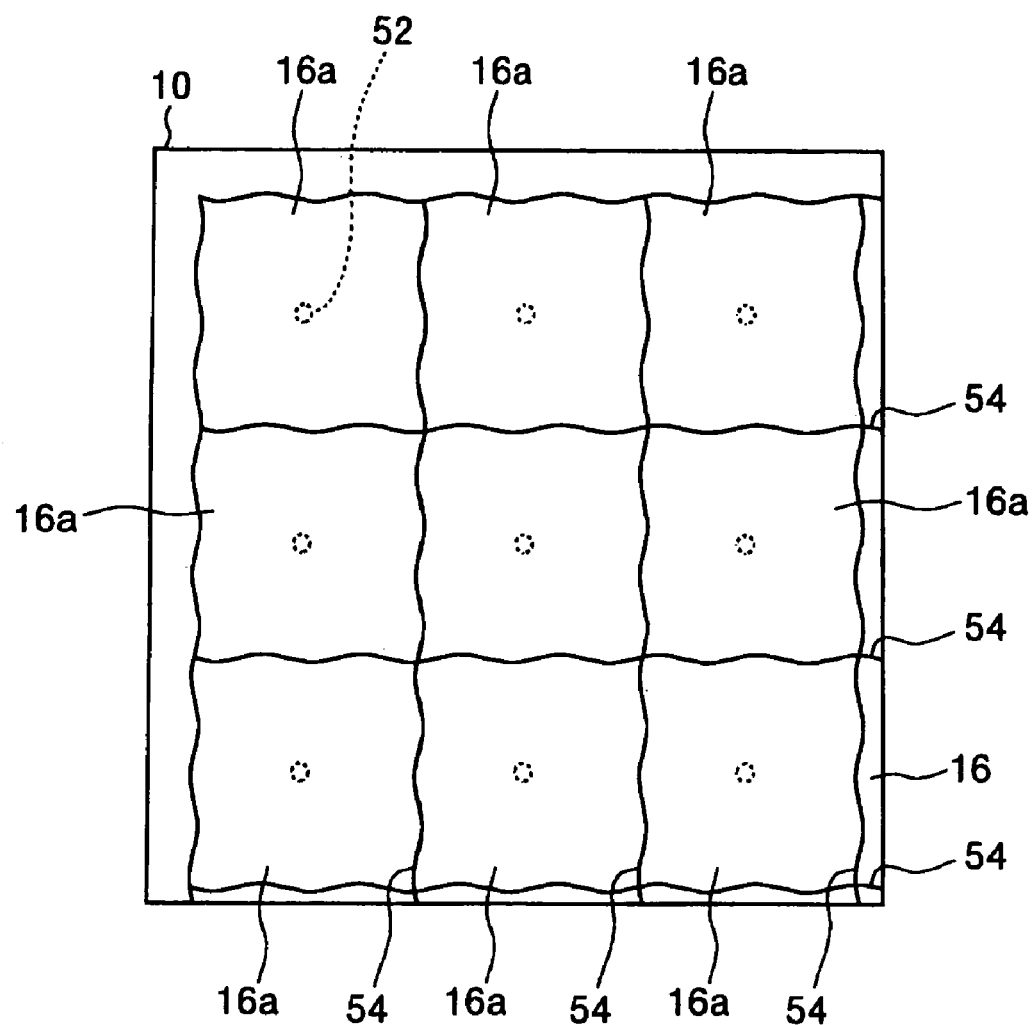
FIG. 6 is a plan view illustrating a silicon film formed on a glass substrate.

FIG. 6 is a plan view illustrating a silicon film 16 formed on the glass substrate 10. As shown in the same figure, each silicon film 16a is formed in a range substantially centered on each grain filter 52. A crystal grain boundary 54 is produced in a position contiguous with a peripheral portion of each silicon film 16a. A thin film transistor is formed using this silicon film 16a formed by arranging the silicon films 16a regularly, to construct the CMOS circuit shown in FIGS. 1 and 2.

Next, a process of forming a thin film transistor using the silicon film 16 (device forming process) will be described.

FIGS. 7 to 12 illustrate a process of forming a CMOS transistor using the above-mentioned silicon film 16. Further, the same figures are cross-sectional views taken along the plane A–A' in FIG. 1.

First, the silicon film 16 is patterned to leave only the single crystal grains 161 and 162 of silicon, and a portion not required for formation of the CMOS transistor is eliminated to shape the transistor region.

Next, a silicon oxide film 20 is formed on the surfaces of the silicon oxide film 12 and the silicon film 16 by a film forming method, such as an electron cyclotron resonance PECVD method (ECR-PECVD method), a PECVD method, or the like. This silicon oxide film 20 functions as a gate insulating film of the thin film transistor.

Figure 7:
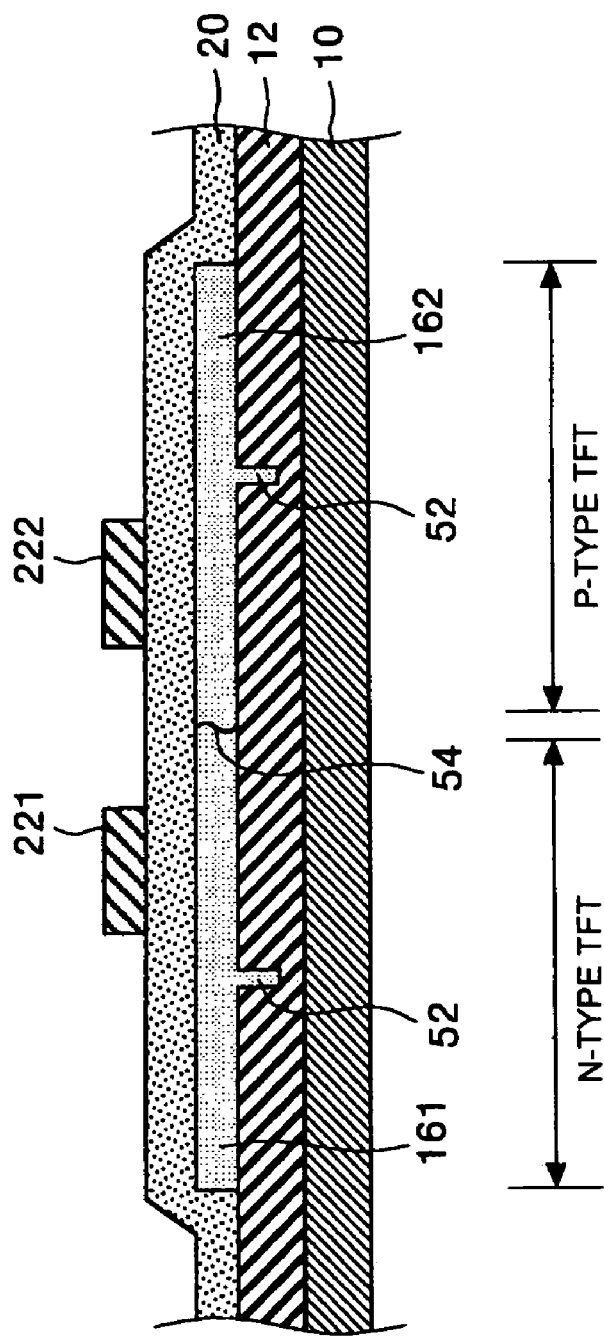
FIG. 7 is a process view explaining an exemplary method of fabricating a CMOS circuit.

Next, gate electrodes 221 and 222 are formed by forming and patterning a metal thin film, such as tantalum, aluminum or the like by a film forming method, such as a sputtering method or the like, as shown in FIG. 7. Herein, in forming the gate electrodes 221 and 222, they are formed by avoiding a region where the crystal grain boundary 54 and the grain filter 52 are formed in the single crystal grains 161 and 162, and by dividing them into regions of two single crystal grains 161 and 162, thus interconnecting the gate electrodes.

Figure 8:
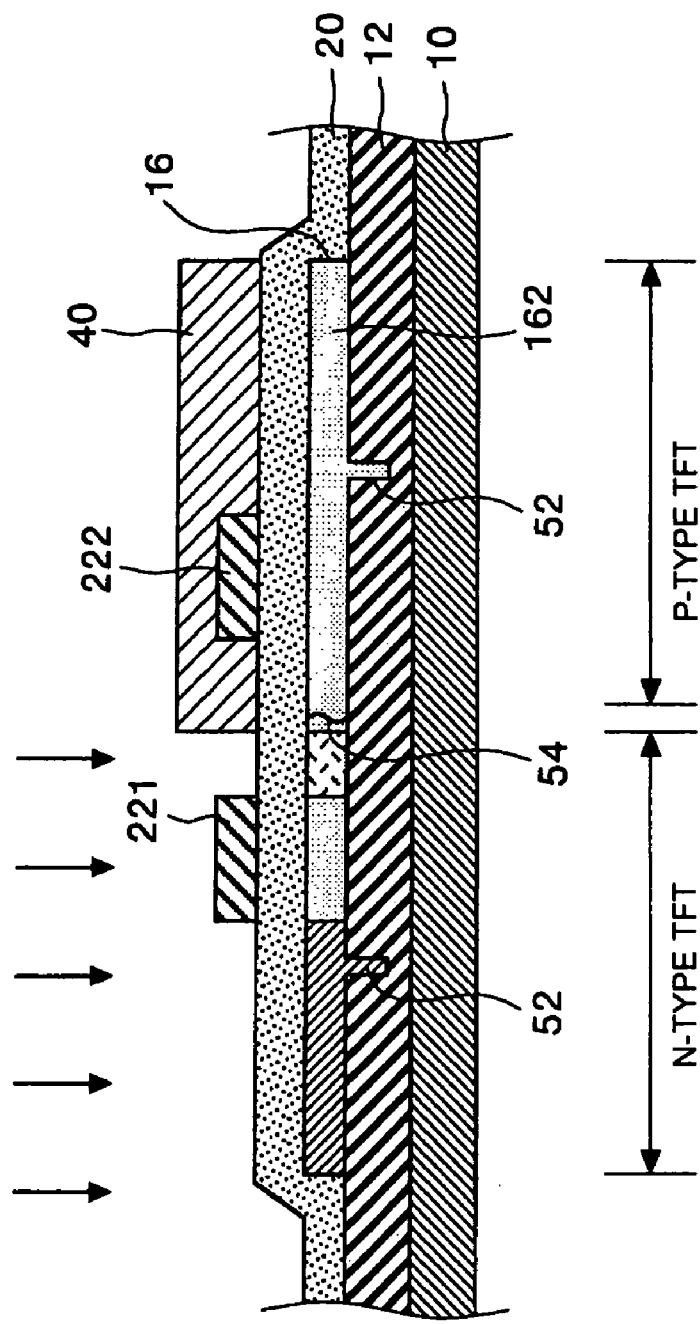
FIG. 8 is a process view explaining an exemplary method of fabricating a CMOS circuit.

As shown in FIG. 8, a resist mask 40 is formed in a region slightly wider than the single crystal grain 162 on the gate electrode 222 and the silicon oxide film 20, and N-type impurity elements are ion-implanted at low-concentration to form the source and drain regions in a self-alignment manner.

Figure 9:
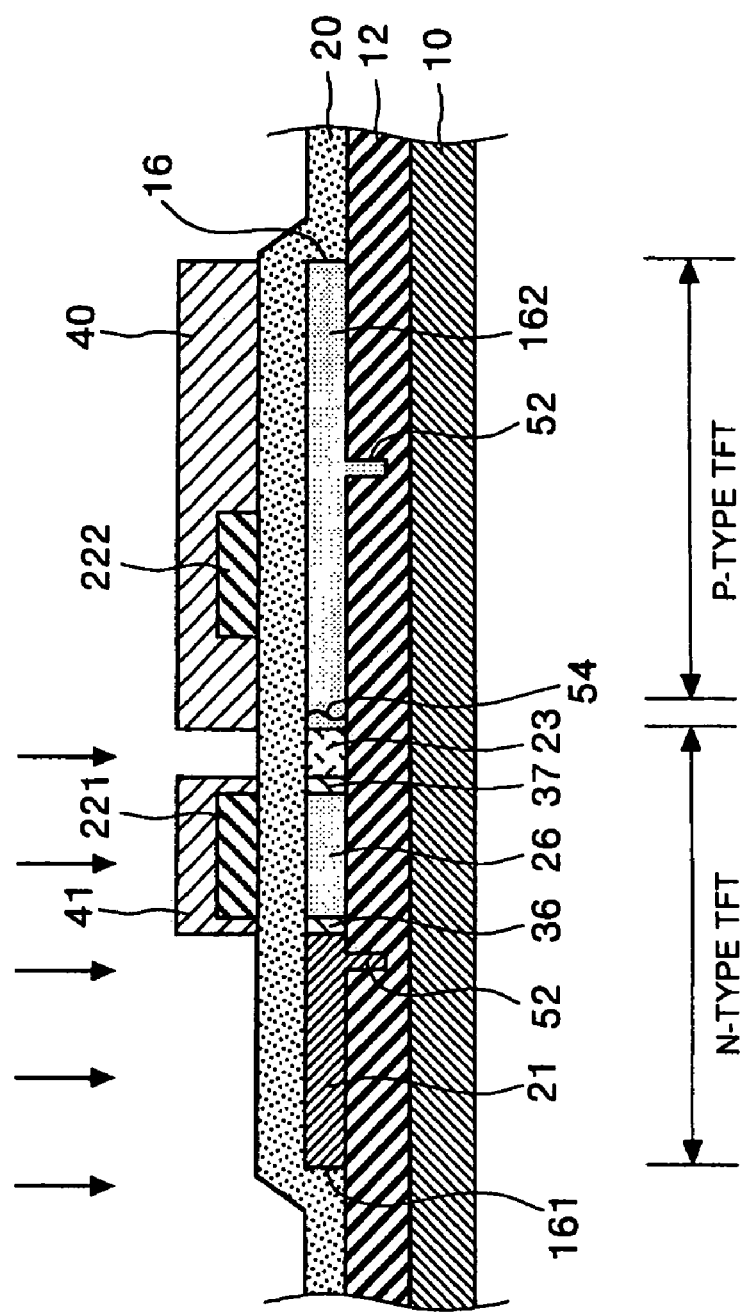
FIG. 9 is a process view explaining an exemplary method of fabricating a CMOS circuit.

Subsequently, as shown in FIG. 9, a resist mask 41 is formed to cover the gate electrode 221 widely, and thereafter the N-type impurity elements are ion-implanted at high concentration. Also, a XeCl excimer laser is adjusted into an energy density of about 400 mJ/cm$^2$ and thereafter the impurity elements are activated by laser irradiation. As a result, the source region 21 formed of a high-concentration impurity region, the electric field relief region 36 formed of a low-concentration impurity region, the drain region 23 formed of a high-concentration impurity region and the electric field relief region 37 formed of a low-concentration impurity region are formed. Also, a portion in which the impurities are not introduced becomes the channel region 26. By doing so, the LDD-structure NMOS transistor can be formed.

Figure 10:
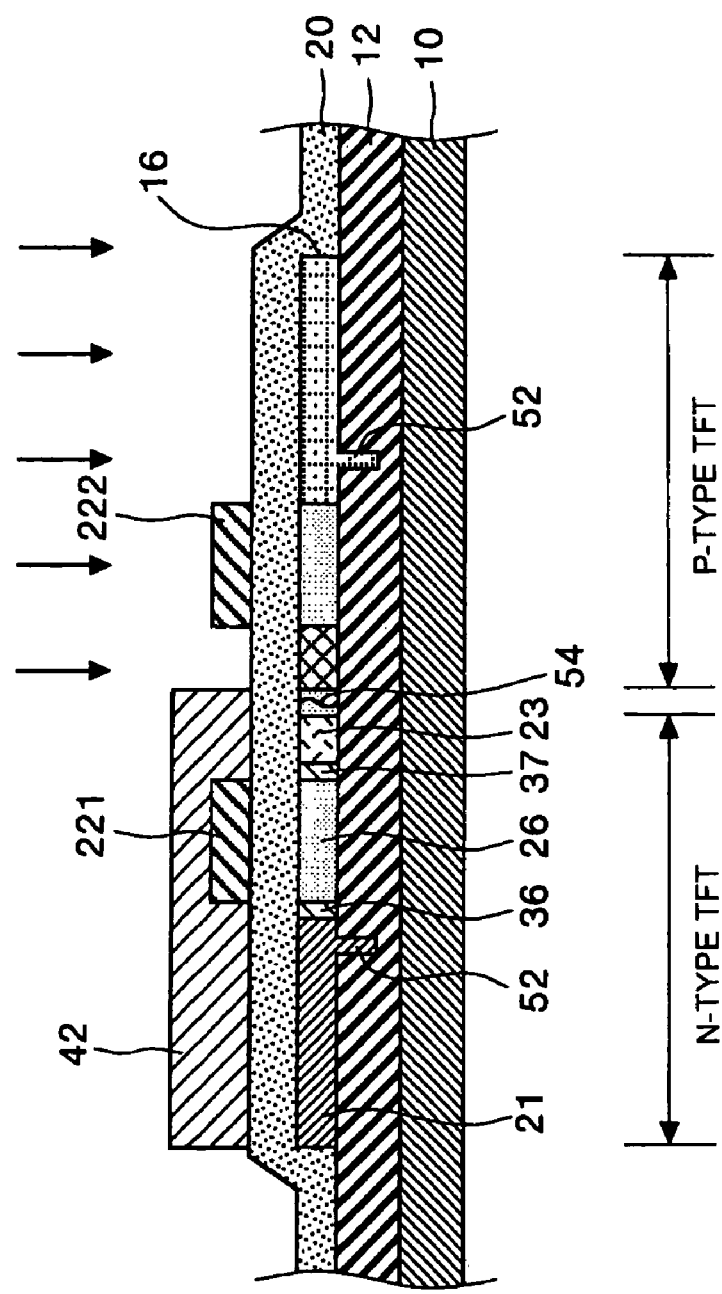
FIG. 10 is a process view explaining an exemplary method of fabricating a CMOS circuit.

Next, the resist masks 40 and 41 are removed, a resist mask 42 is formed in an area that is slightly wider than the single crystal grain 161 on the gate electrode 221 and on the silicon oxide film 20, as shown in FIG. 10, and P-type impurity elements are ion-implanted at low concentration to form the source and drain regions in a self-alignment manner.

Figure 11:
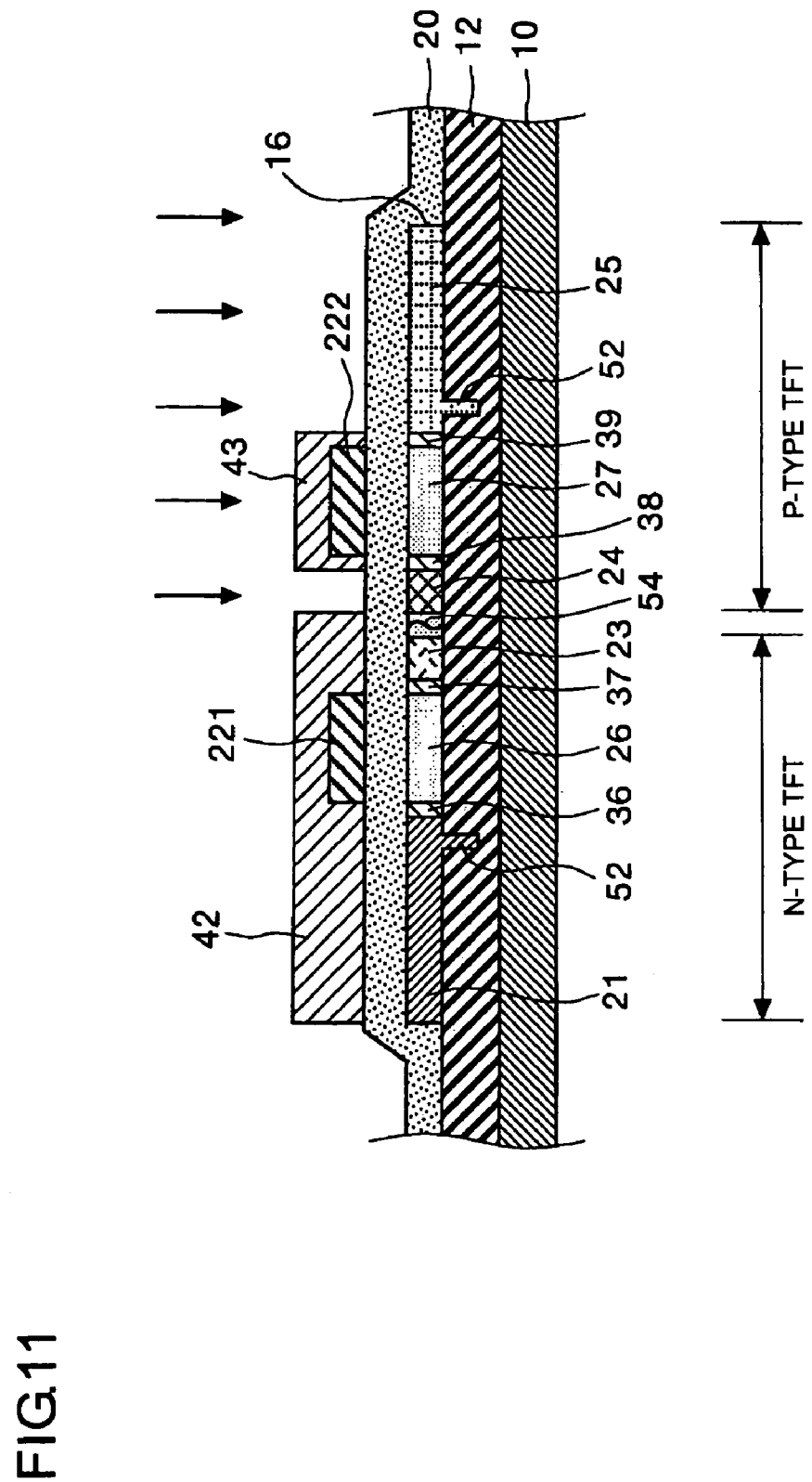
FIG. 11 is a process view explaining an exemplary method of fabricating a CMOS circuit.

Subsequently, as shown in FIG. 11, a resist mask 43 is formed to cover the gate electrode 222 widely, and thereafter the P-type impurity elements are ion-implanted at high-concentration. Also, the XeCl excimer laser is adjusted to an energy density of about 400 mJ/cm$^2$ and thereafter the impurity elements are activated by laser irradiation. As a result, the source region 25 formed of a high-concentration impurity region, the electric field relief region 39 formed of a low-concentration impurity region, the drain region 24 formed of a high-concentration impurity region, and the electric field relief region 38 formed of a low-concentration impurity region are formed. Further, a portion in which impurities are not introduced is the channel region 27. By doing so, the LDD-structure PMOS transistor can be formed. Then, the resist masks 42 and 43 are removed.

Further, the impurity elements mentioned above may be activated by carrying out a heat treatment at a temperature of about 250° C. to 400° C. instead of the laser irradiation.

Figure 12:
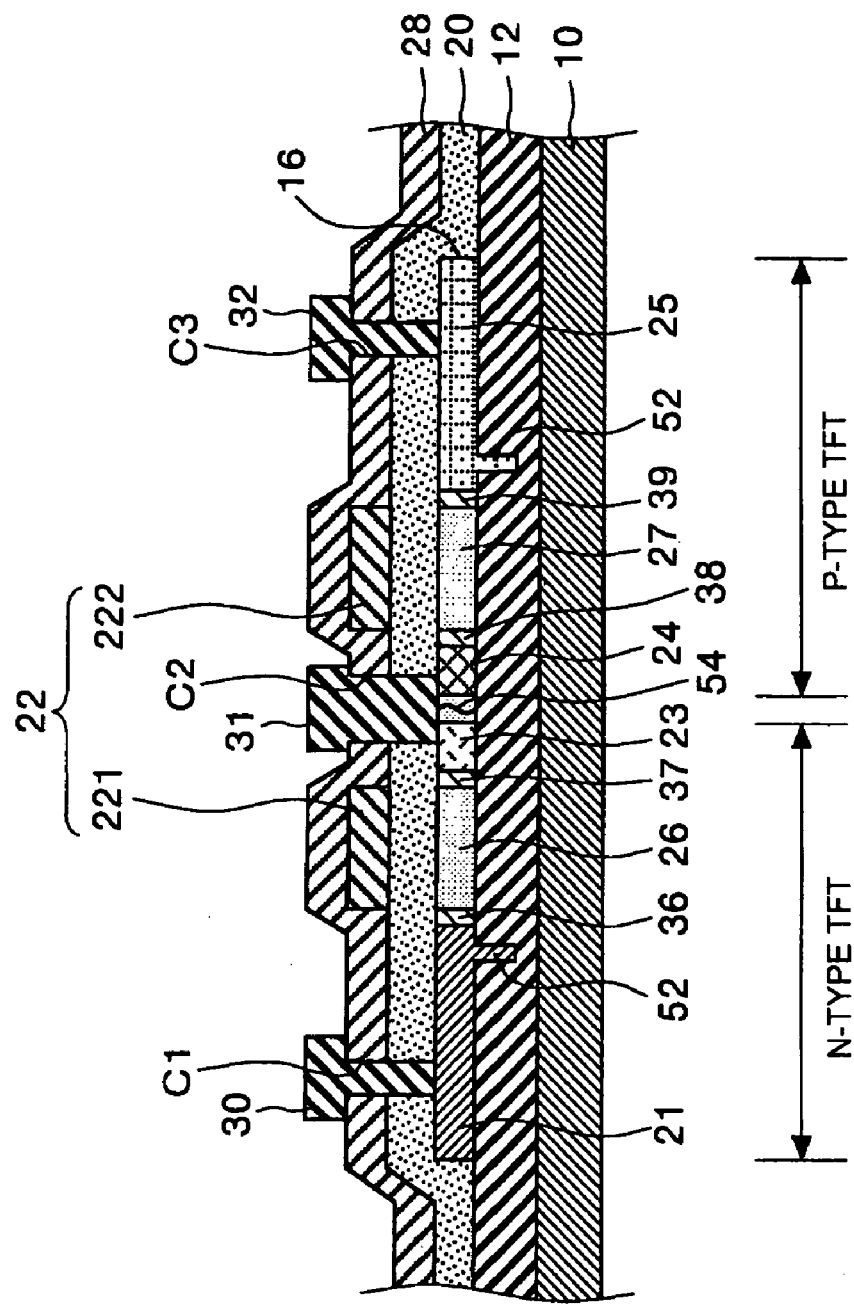
FIG. 12 is a process view explaining an exemplary method of fabricating a CMOS circuit.

Next, as shown in FIG. 12, a silicon oxide film 28 having a film thickness of about 500 nm is formed on the upper faces of the silicon oxide film 20 and the gate electrode 22 by a film forming method, such as the PECVD method or the like. Then, contact holes C1 and C3 reaching the respective source regions 21 and 25 by passing through the silicon oxide films 20 and 28 are formed, and a metal, such as aluminum, tungsten, or the like is buried in these contact holes C1 and C3 by a film forming method, such as the sputtering method or the like, and thereafter, the source electrodes 30 an 32 are formed by patterning.

Further, the contact hole C2, which is connected to the drain regions 23 and 24, by passing through the silicon oxide films 20 and 28, is formed in a region over the drain region 23 and the drain region 24, namely, on the crystal grain boundary 54 and at the vicinity thereof, a metal, such as aluminum, tungsten or the like is buried in the contact hole C2 by the film forming method, such as the sputtering method or the like, and thereafter the drain electrode 31 is formed by patterning. The CMOS circuit of the present exemplary embodiment is formed by the above-described fabrication method.

Second Exemplary Embodiment

Figure 13:
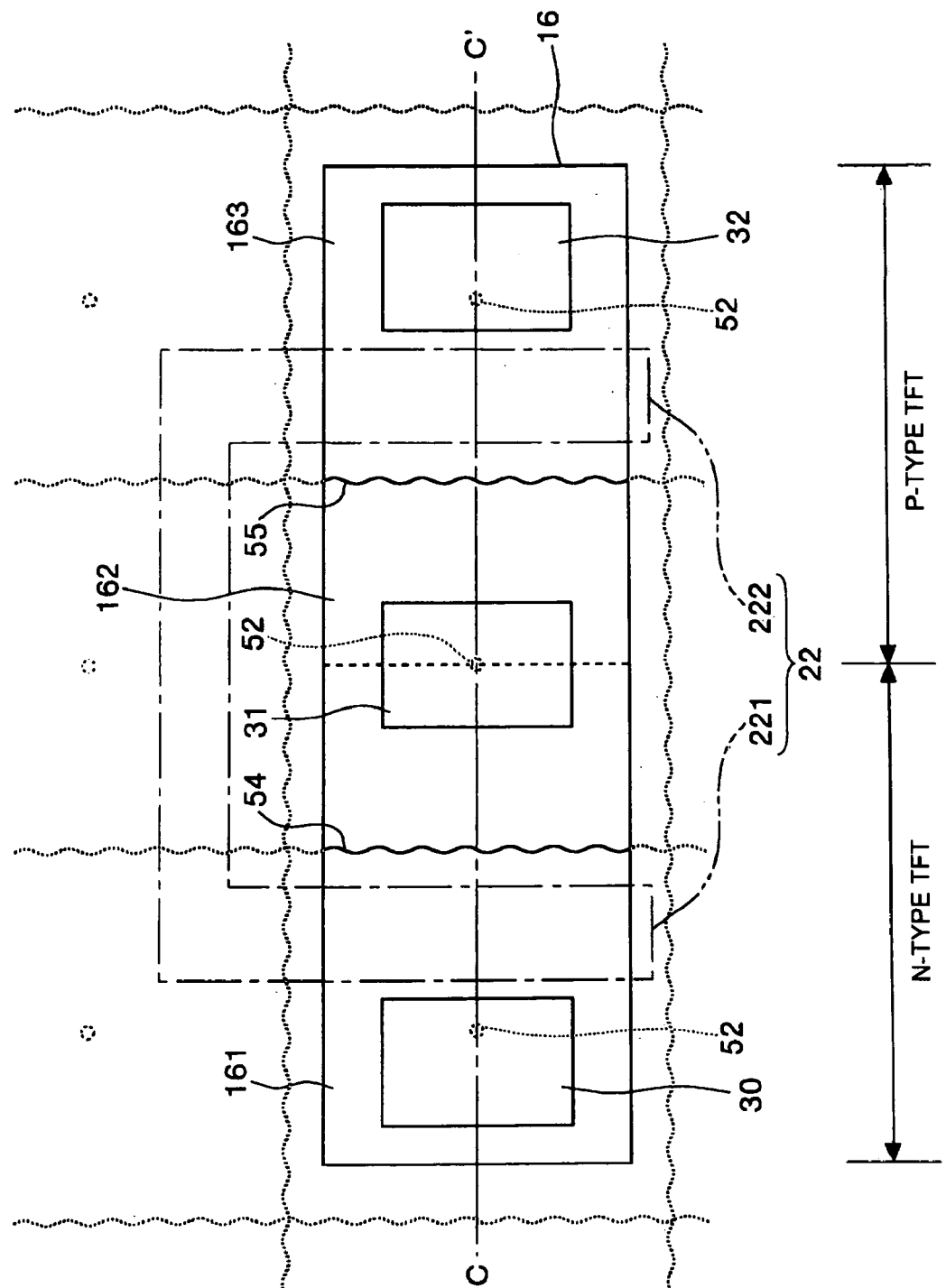
FIG. 13 is a plan view illustrating another CMOS circuit according to an exemplary embodiment of the present invention.
Figure 14:
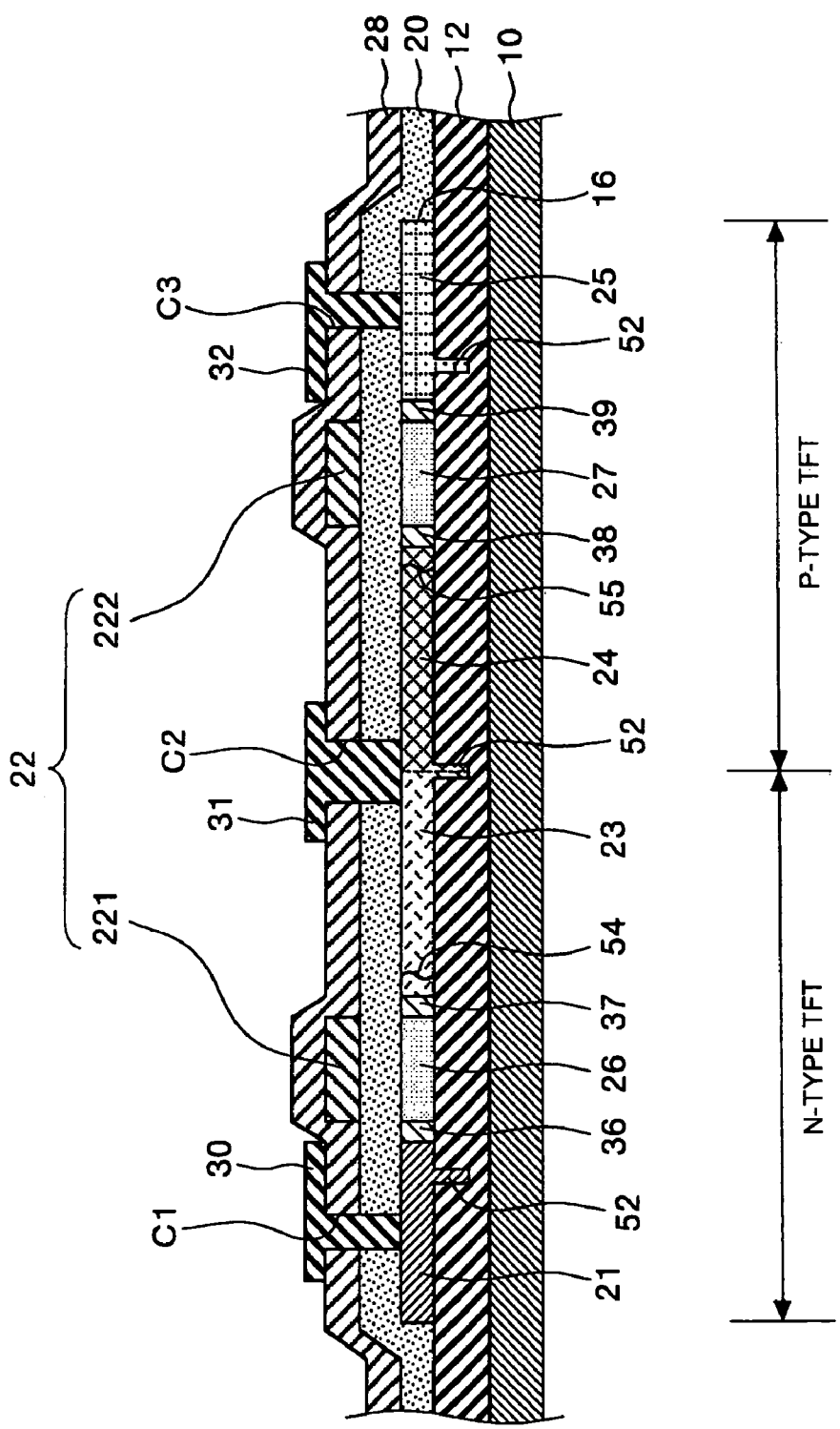
FIG. 14 is a cross-sectional view illustrating another CMOS circuit according to an exemplary embodiment of the present invention.

FIGS. 13 and 14 illustrate the construction of another CMOS circuit according to an aspect of the present invention, in which FIG. 13 is a plane view and FIG. 14 is a cross-sectional view taken along plane C–C' shown in FIG. 1. In FIG. 13, the gate electrode and transistor regions (source region, drain region, and channel region) are primarily highlighted, and other elements are omitted. Further, in FIG. 13, in order to easily recognize shapes of the channel region and the like, the gate electrode is denoted by a dashed line, and is denoted through the underlying channel region.

Further, to assist the understanding, the same members as those of the above-mentioned first exemplary embodiment are imparted with similar reference numerals.

The CMOS circuit according to the present exemplary embodiment is constructed by forming two types of thin film transistors on the glass substrate 10, as shown in FIG. 14. Hereinafter, the construction thereof will be described in detail.

As shown in FIG. 14, the insulating film 12 is formed on the glass substrate 10, and the substantially monocrystalline silicon film 16, which is a semiconductor film, is formed thereon. Further, a plurality of grain filters 52, which become starting points upon crystallization of the semiconductor film, are disposed on the insulating film 12 in the thickness direction, and these grain filters 52 are buried by the substantially monocrystalline silicon film 16. Herein, the substantially monocrystalline silicon film 16 is composed of a plurality of single crystal grains centered on the grain filters 52, and specifically, of three adjacent single crystal grains 161, 162 and 163 formed in a substantially square shape, as described below.

Two types of thin film transistors, namely, NMOS transistor and PMOS transistor are formed using the three adjacent crystal grains 161, 162 and 163, and the CMOS circuit is composed of these thin film transistors.

As shown in FIG. 14, the NMOS transistor is formed using the single crystal grain 161 and the substantially half region of the single crystal grain 162 at the single crystal grain 161 side of the substantially monocrystalline silicon film 16 as patterned. A substantially half region of the single crystal grain 162 at the single crystal grain 161 side and a region of the single crystal grain 161 at the vicinity of the crystal grain boundary 54 include a high-concentration drain region 23. Accordingly, in the NMOS transistor, the region at the vicinity of the crystal grain boundary 54 is composed of a high-concentration impurity region.

Further, a substantially half region at a side opposing the crystal grain boundary 54 in the single crystal grain 161 is a high-concentration source region 21. The portion sandwiched between the source and drain regions 21 and 23 is the channel region 26.

Further, the electric field relief regions 36 and 37 each composed of a low-concentration impurity region are formed at both sides, with the channel region 26 therebetween, and have the LDD structure. In this way, the hot electron effect is suppressed, thereby constructing a highly reliable thin film transistor. Further, in an aspect of the present invention, the LDD structure, in which the electric field relief regions 36 and 37 are provided, is not essential: any structure is allowed in which the electric field relief regions are not provided.

Further, over the channel region 26, on the silicon oxide film 20, the gate electrode 221 is formed, which is interconnected to the gate electrode 222 to form the gate electrode 22; the silicon oxide film 28 is also formed.

Over the source region 21, a source electrode 30 is formed, with the silicon oxide film 20 and the silicon oxide film 28 therebetween. The source electrode 30 is connected to the source region 21 via the contact hole C1.

Further, an output drain electrode 31 is formed on the grain filter 52 and the peripheral upper portion in the drain region 23 via the contact hole C2. The output drain electrode 31 is connected to the drain region 23 via the contact hole C2. Herein, the contact, namely, the output drain electrode 31 forms a common electrode for the PMOS transistor.

Meanwhile, the PMOS transistor is formed using the single crystal grain 163 and the substantially half region of the single crystal grain 162 at the single crystal grain 163 side of the substantially monocrystalline silicon film 16 as patterned. A substantially half region of the single crystal grain 162 at the single crystal grain 163 side and a region of the single crystal grain 163 at the vicinity of the crystal grain boundary 55 include a high-concentration drain region 24. Accordingly, in the PMOS transistor, the region at the vicinity of the crystal grain boundary 55 is composed of a high-concentration impurity region.

Further, a substantially half region at a side opposing the crystal grain boundary 55 in the single crystal grain 163 is a high-concentration source region 25. The portion sandwiched between the source and drain regions 24 and 25 is the channel region 27.

Further, the electric field relief regions 38 and 39 each composed of low-concentration impurity regions are formed at both sides, with the channel region 27 therebetween, and have the LDD structure. In this way, the hot electron effect is suppressed, thereby constructing a highly reliable thin film transistor. Further, in an aspect of the present invention, the LDD structure in which the electric field relief regions 38 and 39 are provided, is not essential: any structure is allowed in which the electric field relief regions are not provided.

Further, over the channel region 27, on the silicon oxide film 20, the gate electrode 222 is formed, which is interconnected to the gate electrode 221 to construct the gate electrode 22; the silicon oxide film 28 is also formed.

Over the source region 25, a source electrode 32 is formed with the silicon oxide film 20 and the silicon oxide film 28 therebetween. The source electrode 32 is connected to the source region 25 via the contact hole C3.

Further, the drain electrode 31 for an output is formed on the grain filter 52 and the peripheral upper portion in the drain region 24 via a contact disposed in the contact hole C2. The output drain electrode 31 is connected to the drain region 24 via the contact hole C2. Herein, the contact, namely, the output drain electrode 31 forms a common electrode for the NMOS transistor.

That is, the output drain electrode 31 in this CMOS circuit is led out by a single contact from the drain regions 23 and 24 of both transistors, and forms a common electrode for the NMOS transistor and the PMOS transistor. The thus constructed CMOS circuit can be made in the same way as in the above-mentioned first exemplary embodiment.

An output from the drain region 23 of the NMOS transistor in this CMOS circuit and an output from the drain region 24 of the PMOS transistor can be led out by the single contact, namely, the drain electrode 31. By this structure, a region between the gate electrodes 221 and 222 can be widened, and a region, from which the contact, namely, the common electrode is taken, is large, thereby securely leading out the output from the drain regions. Further, it is advantageous to make a contact to the metal being an electrode because the semiconductor film on the grain filter 52 is protruded as compared to the other regions.

Figure 15:
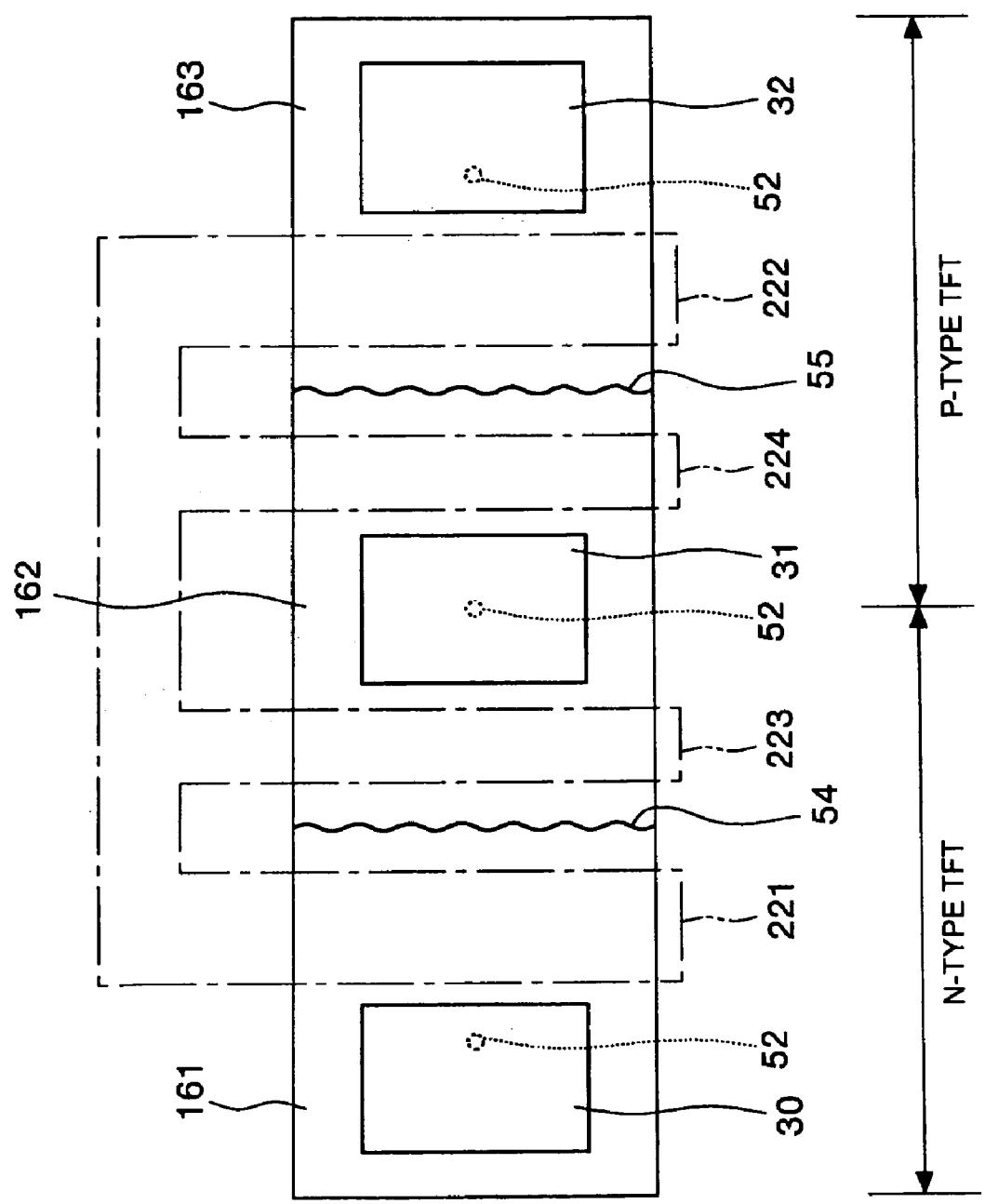
FIG. 15 is a plan view illustrating another CMOS circuit according to an exemplary embodiment of the present invention.

Further, as a modified example of the CMOS circuit shown in FIG. 13, the gate can be formed to have a large length, as shown in FIG. 15. The CMOS circuit shown in FIG. 15 is formed by dividing each gate electrode of the NMOS transistor and the PMOS transistor and by disposing the gate electrodes 223 and 224 even in the region of the single crystal grain 162 in the CMOS circuit shown in FIG. 13. The CMOS circuit is constructed by the NMOS transistor and the PMOS transistor having a large gate length by thus disposing the gate electrodes 223 and 224 even in the region of the single crystal grain 162.

Third Exemplary Embodiment

Figure 16:
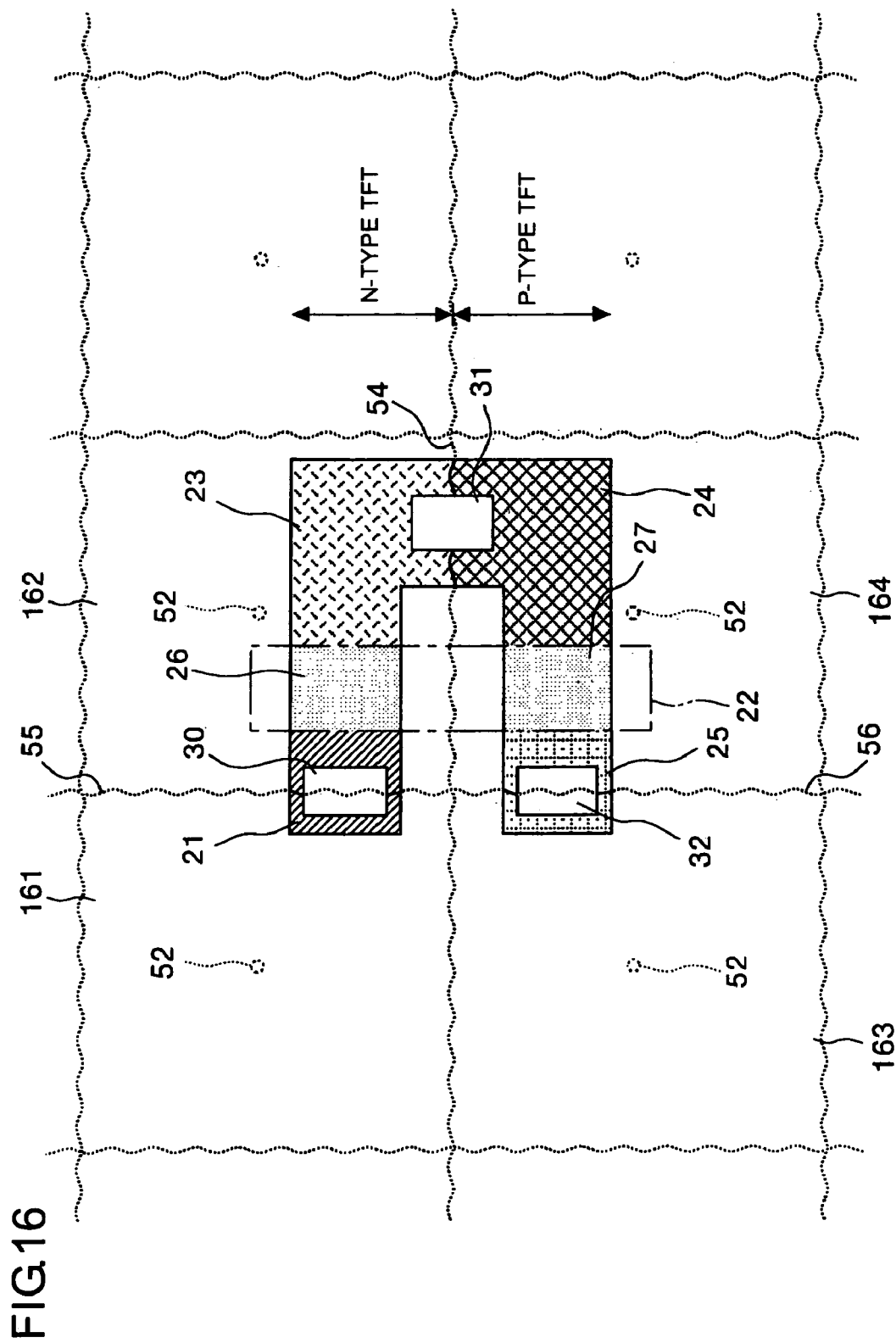
FIG. 16 is a plan view illustrating another CMOS circuit according to an exemplary embodiment of the present invention.

FIG. 16 is a plan view illustrating another example of a CMOS circuit according to an aspect of the present invention. Further, in FIG. 16, a gate electrode and transistor regions (a source region, a drain region, and a channel region) are primarily highlighted and other elements are omitted. In FIG. 16, in order to easily recognize the shape of the channel region, the gate electrode 22 is denoted by a dashed line and is denoted through the underlying channel region. Also, to assist the understanding, the same members as those of the above-mentioned first exemplary embodiment are imparted with similar reference numerals.

The CMOS circuit according to the present exemplary embodiment is constructed by forming two types of thin film transistors using a plurality of single crystal grains formed by adopting the grain filters 52 as starting points upon crystallization of the semiconductor film, formed on an insulating film, on a glass substrate as in the first exemplary embodiment.

That is, two types of thin film transistors, namely, NMOS transistor and PMOS transistor are formed using four adjacent single crystal grains 161, 162, 163 and 164 and these thin film transistors constitute the CMOS circuit.

The NMOS transistor is formed using the single crystal grains 161 and 162. In the single crystal grain 162, a portion at the vicinity of the crystal grain boundary 54 as a region including no grain filters 52 is the drain region 23, and a portion of the region over the single crystal grain 161 and the single crystal grain 162 with the crystal grain boundary 55 substantially perpendicular to the crystal grain boundary 54 therebetween is the source region 21.

Further, the region sandwiched between the source region 21 and the drain region 23 in the single crystal grain 162 is the channel region 26. On the channel region 26, the gate electrode 22 is formed over the single crystal grain 164, with the silicon oxide film (not shown) therebetween.

A source electrode 30, which is connected to the source region 21, is formed on a crystal grain boundary 55 over the source region 21, and on a peripheral top portion thereof via a contact (not shown). An output drain electrode 31 is formed on the crystal grain boundary 54 of the drain region 23 and the peripheral upper portion thereof via a contact (not shown). Herein, the contact, namely, the output drain electrode 31 forms a common electrode for the PMOS transistor.

Meanwhile, the PMOS transistor is formed using the single crystal grains 163 and 164. In the single crystal grain 164, a portion at the vicinity of the crystal grain boundary 54 as a region including no grain filters 52 is the drain region 24, and a portion of the region over the single crystal grain 163 and the single crystal grain 164 with the crystal grain boundary 56 substantially perpendicular to the crystal grain boundary 54 therebetween is the source region 25.

Further, the region sandwiched between the source region 25 and the drain region 24 in the single crystal grain 164 is the channel region 27. On the channel region 27, the gate electrode 22 is formed over the single crystal grain 162, with the silicon oxide film (not shown) therebetween.

A source electrode 32, which is connected to the source region 25, is formed on a crystal grain boundary 56 over the source region 25, and on the peripheral top portion thereof via a contact (not shown). An output drain electrode 31 is formed on the crystal grain boundary 54 of the drain region 24 and the peripheral upper portion thereof via a contact (not shown). Herein, the contact, namely, the output drain electrode 31 forms a common electrode for the NMOS transistor.

Figure 17:
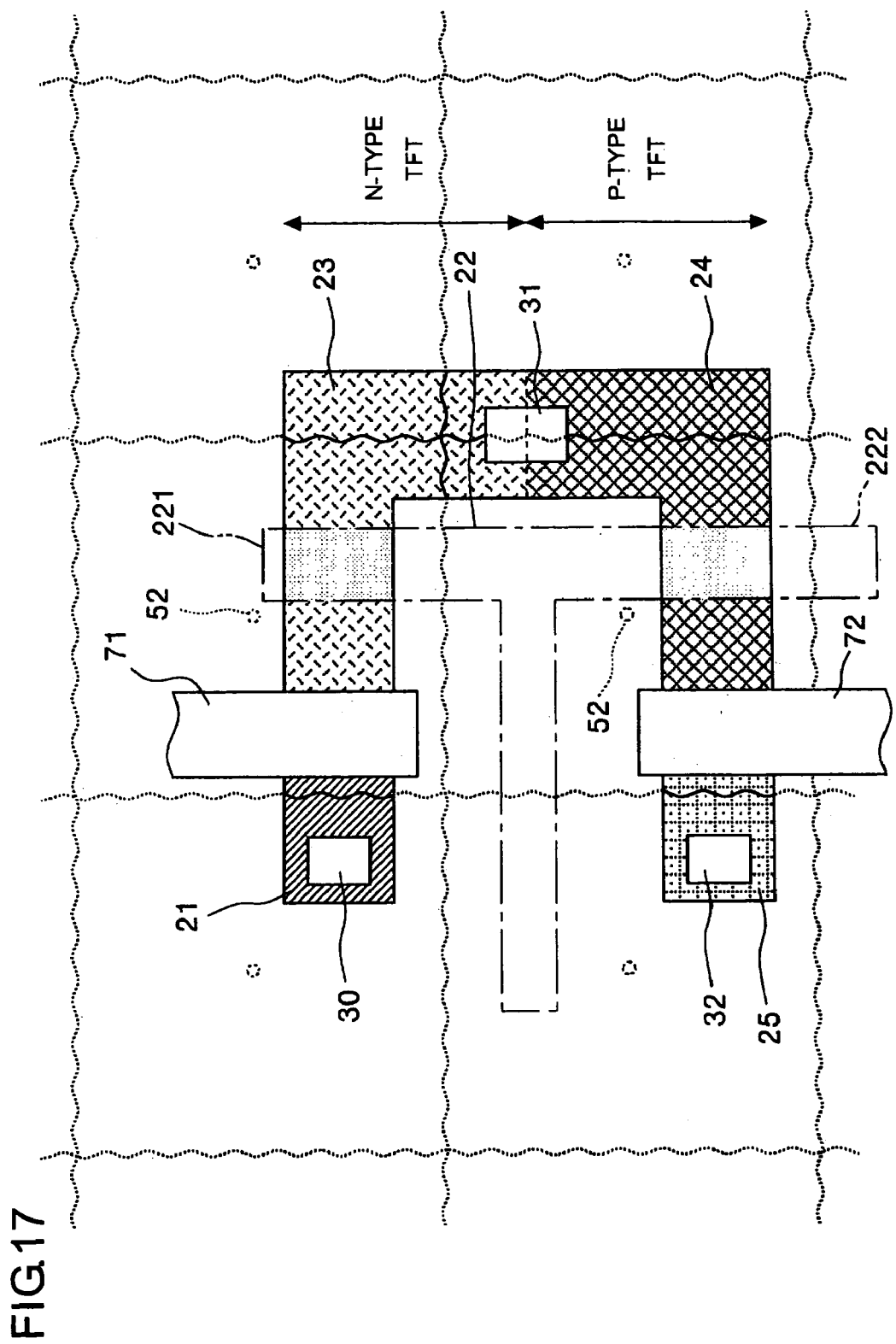
FIG. 17 is a plan view illustrating another CMOS circuit according to an exemplary embodiment of the present invention.

Further, as a modified example of the CMOS circuit shown in FIG. 16, there may be a structure in which a clock control function is added. The CMOS circuit shown in FIG. 17 can be formed by moving a position of the semiconductor thin film and by disposing gates 71 and 72 for clock control between the source electrode 30 and the gate electrode 22 in the source region 21, and between the source electrode 32 and the gate electrode 22 in the source region 25, in a CMOS circuit shown in FIG. 16. The gates 71 and 72 for clock control are connected to a clock line not shown.

Fourth Exemplary Embodiment

Figure 18:
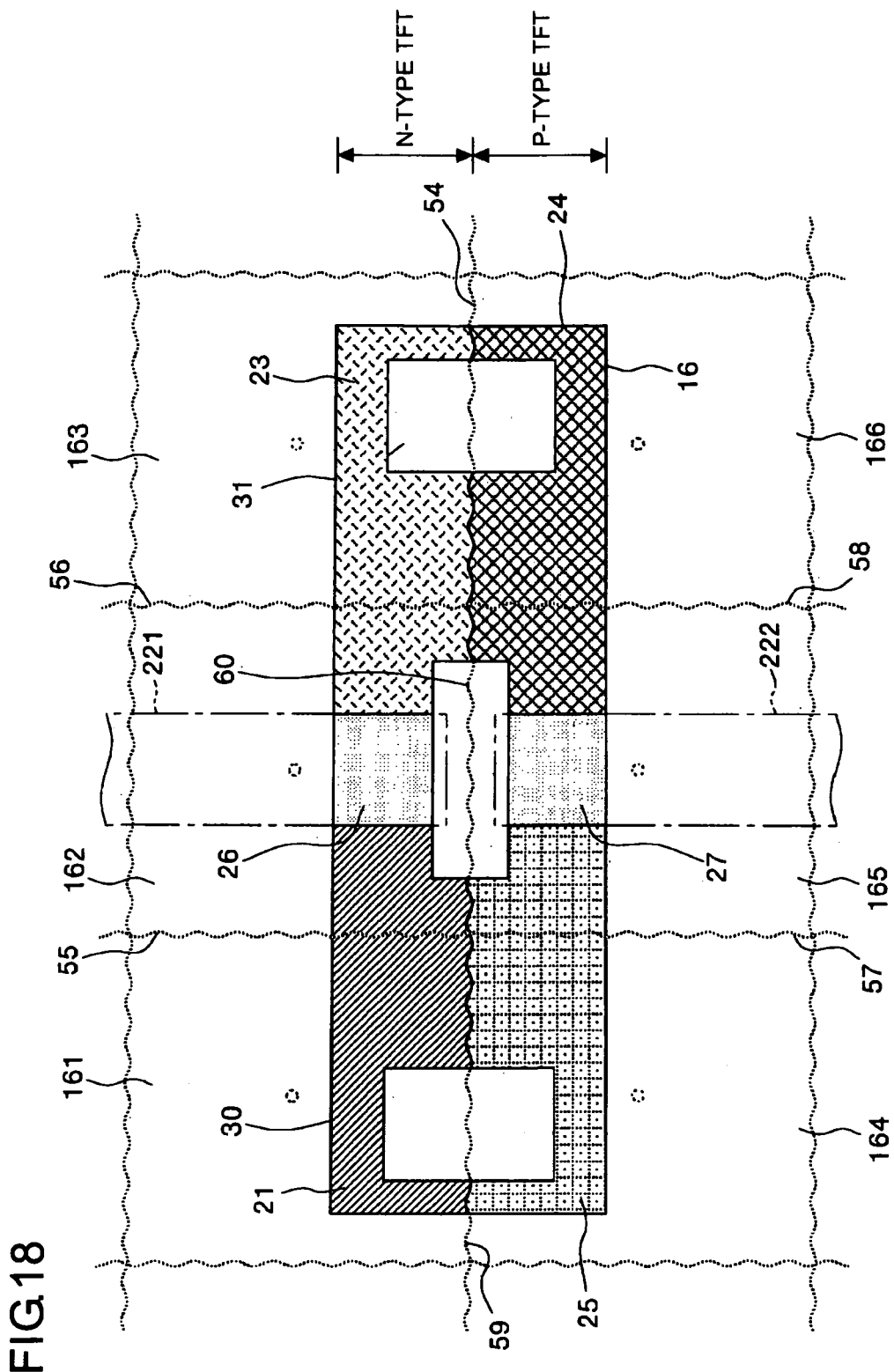
FIG. 18 is a plan view illustrating another CMOS circuit according to an exemplary embodiment of the present invention.

FIG. 18 is a plan view illustrating a pass gate using the CMOS circuit. Further, in FIG. 18, the gate electrode and the transistor regions (source region, drain region and channel region) are primarily highlighted, and other elements are omitted, as in the above case. Further, to assist the understanding, the same members as those of the above-mentioned first exemplary embodiment are imparted with similar reference numerals.

This pass gate is configured by forming two types of thin film transistors using a plurality of single crystal grains formed by adopting the grain filters 52 formed on an insulating film, on a glass substrate as starting points upon crystallization of the semiconductor film, as in the first exemplary embodiment.

That is, a substantially monocrystalline silicon film 16 of a frame shape is formed using six adjacent crystal grains 161, 162, 163, 164, 165 and 166, two types of thin film transistors, namely, NMOS transistor and PMOS transistor are formed by the substantially monocrystalline silicon film 16, and these thin film transistors constitute the CMOS circuit.

The NMOS transistor is formed using the single crystal grains 161, 162 and 163. In the single crystal grains 162 and 163, a portion at the vicinity of the crystal boundaries 54 and 60 over the single crystal grains 162 and 163, with the crystal grain boundary 56 therebetween, as a region including no grain filters 52 is the drain region 23.

Further, in the single crystal grains 161 and 162, a portion at the vicinity of the crystal boundaries 59 and 60 over the single crystal grain 161 and the single crystal grain 162, with the crystal grain boundary 55 therebetween, as a region including no grain filters 52 is the source region 21.

The region sandwiched between the source region 21 and the drain region 23 in the single crystal grain 162 is the channel region 26. Over the channel region 26, the gate electrode 221 is formed, with the silicon oxide film (not shown) therebetween.

A source electrode 30, which is connected to the source region 21, is formed on the crystal grain boundary 59 over the source region 21, and on the peripheral top portion thereof via a contact (not shown). Herein, the contact, namely, the source electrode 30 forms a common electrode for the PMOS transistor.

An output drain electrode 31, which is connected to the drain region 23, is formed on the crystal grain boundary 54 over the drain region 23, and on the peripheral top portion thereof via a contact (not shown). Herein, the contact, namely, the output drain electrode 31 forms a common electrode for the PMOS transistor.

Meanwhile, the PMOS transistor is formed using the single crystal grains 164, 165 and 166. In the single crystal grains 165 and 166, a portion at the vicinity of the crystal boundaries 54 and 60 over the single crystal grain 165 and the single crystal grain 166, with the crystal grain boundary 58 therebetween, as a region including no grain filters 52 is the drain region 24.

Further, in the single crystal grains 164 and 165, a portion at the vicinity of the crystal boundaries 59 and 60 over the single crystal grain 164 and the single crystal grain 165, with the crystal grain boundary 57 therebetween, as a region including no grain filters 52 is the source region 25.

The region sandwiched between the source region 25 and the drain region 24 in the single crystal grain 165 is the channel region 27. Further, the gate electrode 222 is formed on the channel region 27, with a silicon oxide film (not shown) therebetween.

Further, on the crystal grain boundary 59 over the source region 25 and on the peripheral upper portion, the source electrode 30, which is connected to the source region 25, is formed via the contact (not shown). Herein, the contact, namely, the source electrode 30 forms a common electrode for the NMOS transistor.

An output drain electrode 31 is formed on a crystal grain boundary 54 of the drain region 24 and on the peripheral upper portion thereof via the contact (not shown). Herein, the contact, namely, the output drain electrode 31 forms a common electrode for the NMOS transistor.

Fifth Exemplary Embodiment

Next, an example to which the CMOS circuit according to an aspect of the present invention is applied will be described. The CMOS circuit according to an aspect of the present invention can be used as, for example, a switching device of a liquid crystal display device or a driver device or the like of an organic EL display device in the electro-optical device.

Figure 19:
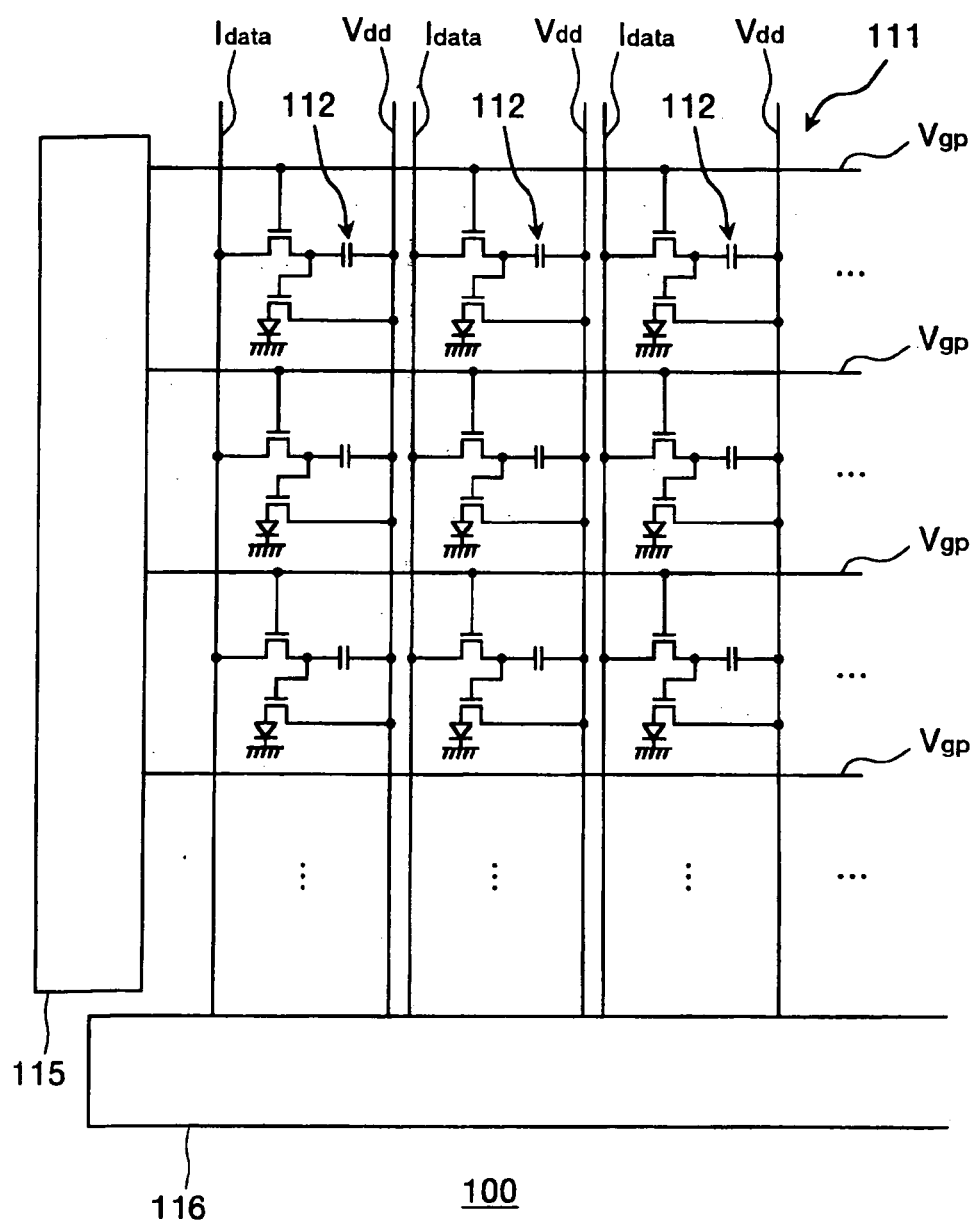
FIG. 19 is a construction schematic illustrating an instance of an electro-optical device according to an exemplary embodiment of the present invention.

FIG. 19 illustrates a connection state of a circuit of a display device 100, which is an example of an electro-optical device according to an aspect of the present invention. As shown in FIG. 19, the display device 100 is constructed by arranging the pixel region 112 in the display region 111. The pixel region 112 uses a thin film transistor for driving the organic EL light-emitting device.

A light-emitting control line (Vgp) and a writing control line are supplied from the driver region 15 to each pixel region 112. A current line (Idata) and a power line (Vdd) from the driver region 116 are supplied to each pixel region 112. A current program is made on each pixel region by controlling the writing control line and the current line (Idata), and light-emitting is controlled by controlling the light-emitting control line (Vgp). In this display device 100, the CMOS transistor according to an aspect of the present invention is used in the driver regions 115 and 116.

Further, the above-mentioned circuit is an example of the circuit in which the current light-emitting device is used in the light-emitting element and other circuit construction may be used. Further, in addition to the current light-emitting device, a liquid crystal display device may be used in the light-emitting element. In this case, it is preferable that the circuit structure be changed corresponding to the liquid crystal display device.

Sixth Exemplary Embodiment

FIG. 20 illustrates a concrete example of the electronic apparatus to which the above-mentioned display device 100 can be applied, that is, an electronic apparatus to which the CMOS circuit according to an aspect of the present invention can be applied.

Figure 20A:
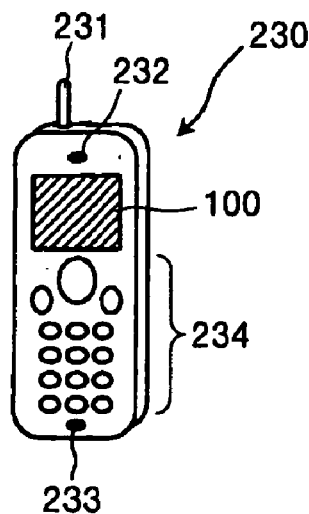
FIGS. 20(A)–20(F) illustrate an instance of an electronic apparatus according to an exemplary embodiment of the present invention.

FIG. 20(A) is a portable telephone 230 in which the CMOS circuit according to an aspect of the present invention is mounted, and the portable telephone 230 includes an electro-optical device (display panel) 100, an antenna portion 231, an audio output portion 232, an audio input portion 233, and an operation portion 234 and the like. In the portable telephone 230, the above-mentioned display device 100 can be used as a display panel and a CMOS circuit according to an aspect of the present invention can be applied to, for example, a display panel or an embedded integrated circuit.

Figure 20B:
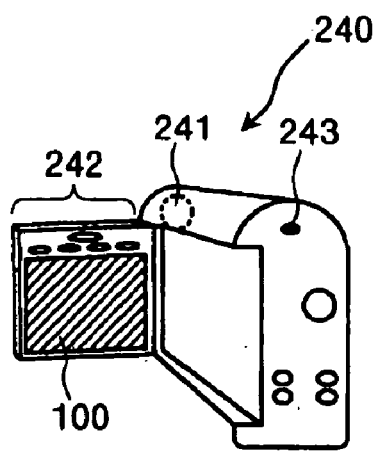

FIG. 20(B) is a video camera 240 in which the CMOS circuit according to an aspect of the present invention is mounted, and the video camera 240 includes an electro-optical device (display panel) 100, an image receiving portion 241, an operation portion 242, an audio input portion 243 and the like. In the video camera 240, the above-mentioned display device 100 may be used as a display panel and a CMOS circuit according to an aspect of the present invention can be applied to, for example, a display panel or an embedded integrated circuit.

Figure 20C:
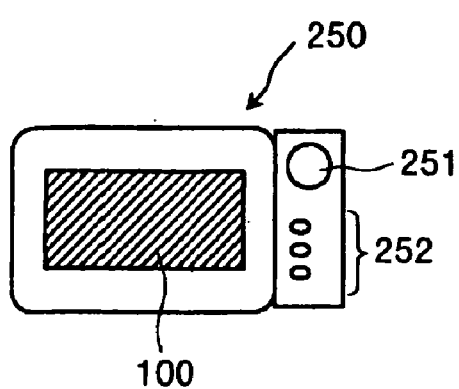

FIG. 20(C) is a portable personal computer 250 in which the CMOS circuit according to an aspect of the present invention is mounted, the portable personal computer 250 includes an electro-optical device (display panel) 100, a camera unit 251, an operation portion 252 and the like. In the portable personal computer 250, the above-mentioned display device 100 can be used as a display panel and the CMOS circuit according to an aspect of the present invention can be applied to, for example, a display panel or an embedded integrated circuit.

Figure 20D:
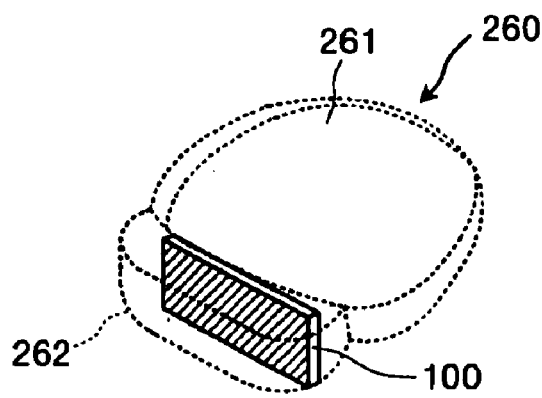

FIG. 20(D) is a head mount display 260 in which a CMOS circuit according to an aspect of the present invention is mounted, the head mount display 260 includes an electro-optical device (display panel) 100, a band unit 261, an optical system receiving unit 262 and the like. In the head mount display 260, the above-mentioned display device 100 can be used as a display panel and the CMOS circuit according to an aspect of the present invention can be applied to, for example, a display panel or an embedded integrated circuit.

Figure 20E:
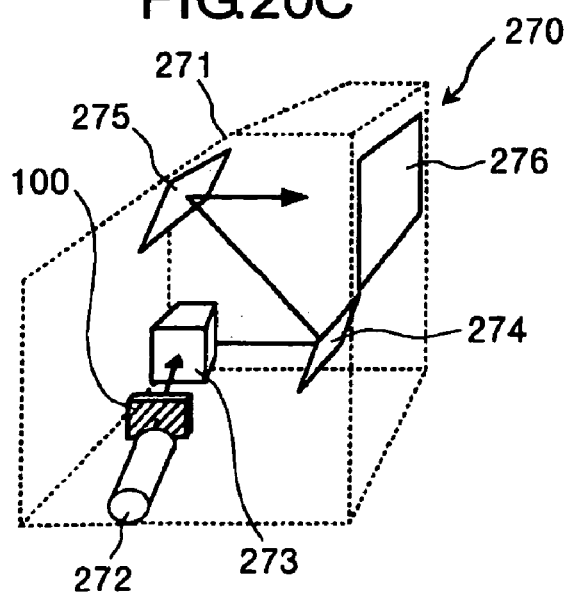

FIG. 20(E) is a rear type projector 270 in which a CMOS circuit according to an aspect of the present invention is mounted, the rear type projector 270 includes an electro-optical device (light modulator) 100, a light source 272, an optical system 273, a mirror 274, a mirror 275, a screen 276 and the like in a case 271. In the rear type projector 270, the above-mentioned display device 100 can be used as the light modulator and the CMOS circuit according to an aspect of the present invention can be applied to, for example, a light modulator or an embedded integrated circuit.

Figure 20F:
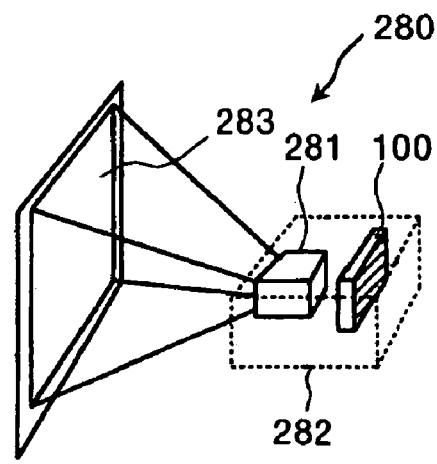

FIG. 20(F) is a front type projector 280 in which a CMOS circuit according to an aspect of the present invention is mounted, the front type projector 280 includes an electro-optical device (image display source) 100, an optical system 281, and the like in a case 282, and is adapted to display an image on the screen 283. In the front type projector 280, the above-mentioned display device 100 can be used as the image display source, and the CMOS circuit according to an aspect of the present invention can be applied to, for example, the image display source or an embedded integrated circuit.

Further, a CMOS circuit according to an aspect of the present invention is not limited to the present electronic apparatus and can be applied to all electronic apparatuses. For example, in addition to the above-mentioned device, the present invention can be applied to the manufacture of a wrist watch, an IC card, a facsimile apparatus having a display function, a finder of a digital camera, a portable TV, a DSP device, a PDA, an electronic diary, an electro-optical guest board, advertisement display or the like, and a high quality electronic apparatus can be realized.

Figure 21:
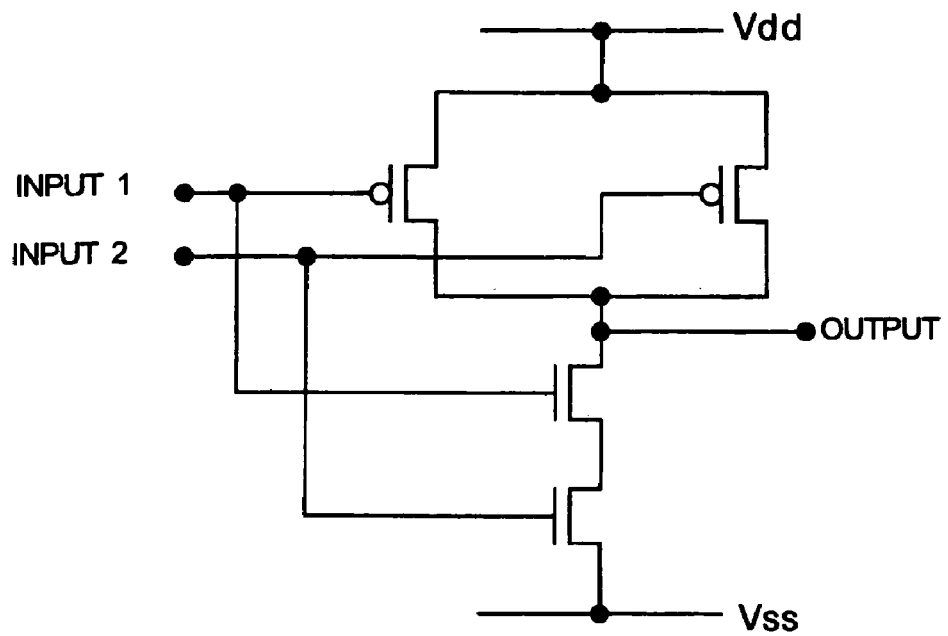
FIG. 21 is a circuit schematic illustrating a NAND circuit.
Figure 22:
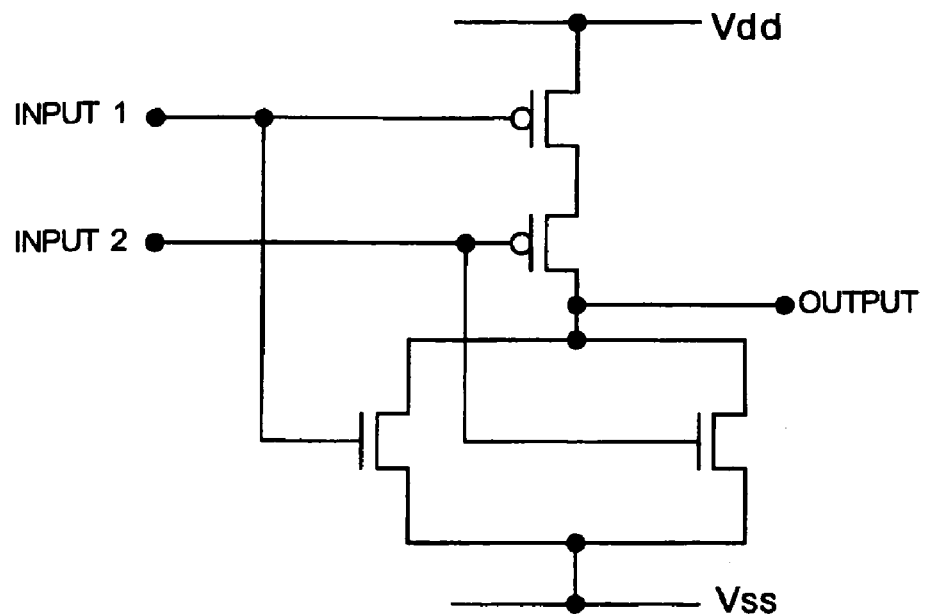
FIG. 22 is a circuit schematic illustrating a NOR circuit.

Further, an aspect of the present invention includes the CMOS circuit including NMOS transistor and PMOS transistor, and if it is a circuit including a structure in which an output from the NMOS transistor and an output from the PMOS transistor are interconnected, comprehensive application thereof is available. That is, it is suitable that the present invention is used for the NOT circuit shown in FIG. 3, the NAND circuit shown in FIG. 21, and the NOR circuit shown in FIG. 22.

What is claimed is:

1. A complementary transistor circuit, comprising:
a first transistor that has a first channel region, a first drain, and a first source and that has a first-conductivity type;
a second transistor that has a second-conductivity type that has a second channel region, a second drain, and a second source;
the first transistor and the second transistor being formed using a plurality of single crystal grains;
each of the plurality of single crystal grains covering one of a plurality of concave portions that are formed on an insulating substrate;
the plurality of single crystal grains including a first single crystal grain that is formed on a first concave portion of the plurality of concave portions and a second single crystal grain that is formed on a second concave portion of the plurality of concave portions;
a crystal grain boundary being located between the first single crystal and the second single crystal;
a common electrode that is provided on the crystal grain boundary and that is coupled to one of the first drain and the first source and one of the second drain and the second source;
at least one of the first drain and the first source being formed in the first single crystal grain;
at least one of the second drain and the second source being formed in the second single crystal grain;
one of the first drain and the first source being disposed between the crystal grain boundary and the first channel region;
one of the second drain and the second source being disposed between the crystal grain boundary and the second channel region; and
the first channel region not covering the first concave portion.

2. The complementary transistor circuit according to claim 1,
the plurality of single crystal grains being formed by carrying out by a heat treatment of a semiconductor film that has a first portion in the one concave portion and a second portion other than the first portion under a condition that the first portion is not melted while the second portion is melted.

3. The complementary transistor according to claim 2, the heat treatment being carried out by a laser irradiation.

4. An electro-optical device, comprising:
the complementary transistor circuit according to claim 1.

5. An electronic apparatus, comprising:
the complementary transistor circuit according to claim 1.

6. The complementary transistor circuit according to claim 1, the second channel region not covering the second concave portion.

* * * * *